(12) United States Patent
Oda et al.

(10) Patent No.: US 9,048,220 B2
(45) Date of Patent: Jun. 2, 2015

(54) METHOD OF CRYSTALLIZING SILICON THIN FILM AND METHOD OF MANUFACTURING SILICON THIN-FILM TRANSISTOR DEVICE

(75) Inventors: Tomohiko Oda, Osaka (JP); Takahiro Kawashima, Osaka (JP)

(73) Assignee: JOLED INC., Tokyo (JP)

( * ) Notice: Subject to any disclaimer, the term of this patent is extended or adjusted under 35 U.S.C. 154(b) by 14 days.

(21) Appl. No.: 13/228,804

(22) Filed: Sep. 9, 2011

(65) Prior Publication Data

US 2011/0318891 A1 Dec. 29, 2011

Related U.S. Application Data

(63) Continuation of application No. PCT/JP2010/004110, filed on Jun. 21, 2010.

(51) Int. Cl.
| | |
|---|---|
| H01L 21/00 | (2006.01) |
| H01L 21/84 | (2006.01) |
| H01L 29/423 | (2006.01) |
| H01L 29/66 | (2006.01) |
| H01L 29/786 | (2006.01) |
| H01L 27/12 | (2006.01) |

(52) U.S. Cl.
CPC .... H01L 29/42384 (2013.01); H01L 29/66765 (2013.01); H01L 29/78678 (2013.01); *H01L 27/1281* (2013.01); *H01L 27/1285* (2013.01)

(58) Field of Classification Search
CPC ................. H01L 2924/00; H01L 2224/32225; H01L 29/7869; H01L 2224/48227; H01L 2224/73204
USPC ........................................................ 438/166
See application file for complete search history.

(56) References Cited

U.S. PATENT DOCUMENTS

| | | | |
|---|---|---|---|
| 5,905,274 A | 5/1999 | Ahn et al. | |
| 6,008,065 A | 12/1999 | Lee et al. | |
| 6,081,308 A | 6/2000 | Jeong et al. | |

(Continued)

FOREIGN PATENT DOCUMENTS

| | | |
|---|---|---|
| JP | 09-171197 | 6/1997 |
| JP | 10-256561 | 9/1998 |

(Continued)

OTHER PUBLICATIONS

Toshiaki Arai et al., "Micro Silicon Technology for Active Matrix OLED Display", SID 07 Digest, 2007, pp. 1370-1373.

(Continued)

*Primary Examiner* — Tony Tran
(74) *Attorney, Agent, or Firm* — Greenblum & Bernstein P.L.C.

(57) ABSTRACT

A method of crystallizing a silicon thin film, which enables uniforming the size of a crystalline grain of the silicon thin film, includes: a second process of stacking, on a substrate, a first gate electrode having a first reflectivity; a third process of stacking a second gate electrode on the first gate electrode, the second gate electrode having a second reflectivity lower than the first reflectivity and including a top face having an area smaller than an area of the top face of the first gate electrode; a fourth process of stacking a gate insulation film to cover a first region and a second region; a fifth process of stacking a noncrystalline silicon thin film on the stacked gate insulation film; and a sixth process of crystallizing the noncrystalline silicon thin film by irradiating the noncrystalline silicon thin film from above with a laser beam.

12 Claims, 15 Drawing Sheets

(56) References Cited

U.S. PATENT DOCUMENTS

| | | |
|---|---|---|
| 6,331,443 B1 | 12/2001 | Lee et al. |
| 6,333,518 B1 | 12/2001 | Seo et al. |
| 6,337,520 B1 | 1/2002 | Jeong et al. |
| 6,339,230 B1 | 1/2002 | Lee et al. |
| 6,340,610 B1 | 1/2002 | Ahn et al. |
| 6,380,098 B1 | 4/2002 | Jeong et al. |
| 6,445,004 B1 | 9/2002 | Jeong et al. |
| 6,486,494 B2 | 11/2002 | Jeong et al. |
| 6,548,829 B2 | 4/2003 | Ahn et al. |
| 6,570,182 B2 | 5/2003 | Jeong et al. |
| 6,573,127 B2 | 6/2003 | Seo |
| 6,582,982 B2 | 6/2003 | Jeong et al. |
| 6,661,026 B2 | 12/2003 | Lee et al. |
| 6,686,606 B2 | 2/2004 | Jeong et al. |
| 6,815,321 B2 | 11/2004 | Ahn et al. |
| 6,946,681 B2 | 9/2005 | Jeong et al. |
| 7,105,392 B2 * | 9/2006 | Isobe et al. .................... 438/166 |
| 7,176,489 B2 | 2/2007 | Ahn et al. |
| RE41,363 E | 6/2010 | Lee et al. |
| 2001/0011726 A1 | 8/2001 | Hayashi et al. |
| 2002/0009838 A1 | 1/2002 | Ahn et al. |
| 2002/0013021 A1 | 1/2002 | Jeong et al. |
| 2002/0048861 A1 | 4/2002 | Seo |
| 2002/0060323 A1 | 5/2002 | Jeong et al. |
| 2002/0106825 A1 | 8/2002 | Lee et al. |
| 2002/0140034 A1 | 10/2002 | Ahn et al. |
| 2002/0175395 A1 | 11/2002 | Jeong et al. |
| 2003/0160252 A1 | 8/2003 | Jeong et al. |
| 2003/0164520 A1 | 9/2003 | Ahn et al. |
| 2004/0140566 A1 | 7/2004 | Jeong et al. |
| 2004/0229413 A1 * | 11/2004 | Ahn et al. ..................... 438/158 |
| 2005/0214986 A1 * | 9/2005 | Tanaka et al. ................. 438/149 |
| 2010/0264422 A1 | 10/2010 | Hayashi et al. |
| 2011/0261019 A1 * | 10/2011 | Makita et al. ................. 345/175 |

FOREIGN PATENT DOCUMENTS

| | | |
|---|---|---|
| JP | 2000-323407 | 11/2000 |
| JP | 2001-217423 | 8/2001 |

OTHER PUBLICATIONS

U.S. Appl. No. 13/212,465 to Tomoya Kato et al., filed Aug. 18, 2011.
International Search Report and Written Opinion for parent International Application No. PCT/JP2010/004110, mailed Jul. 13, 2010.

* cited by examiner

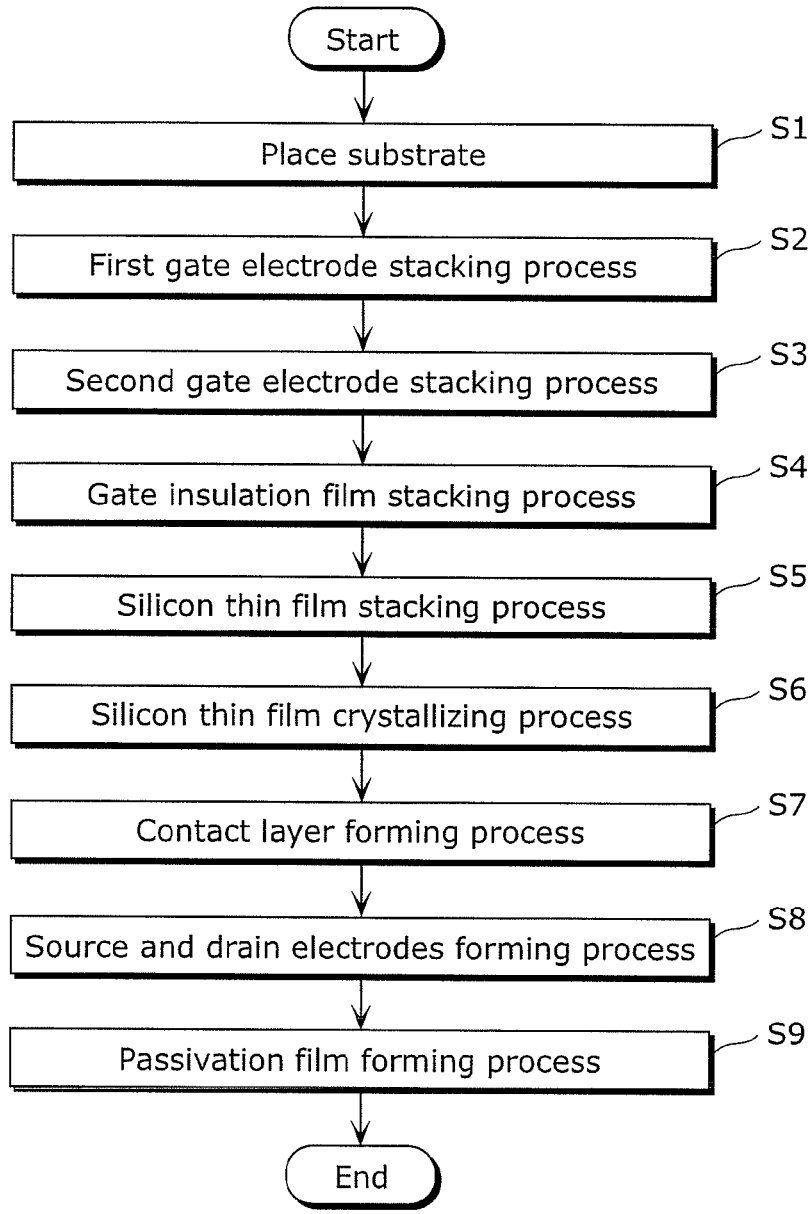
FIG. 2
FIG. 3A
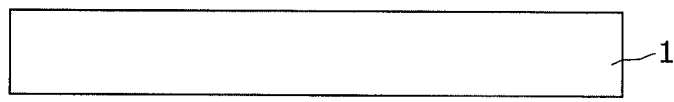
FIG. 3B
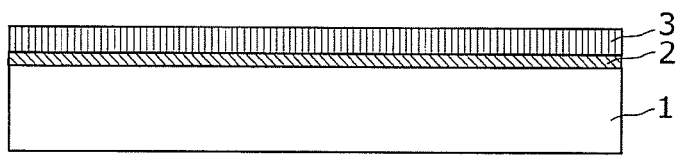

FIG. 4
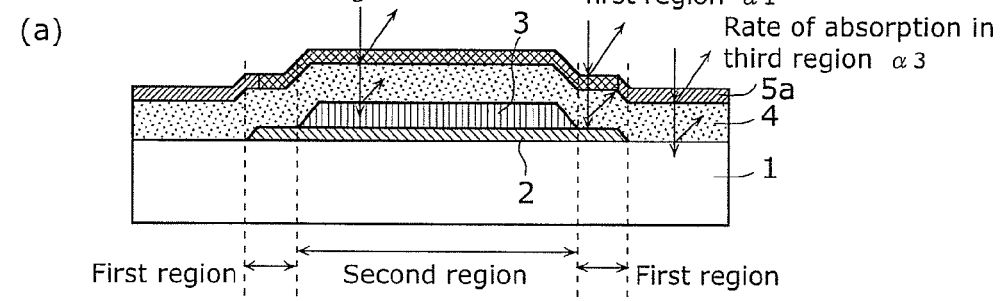
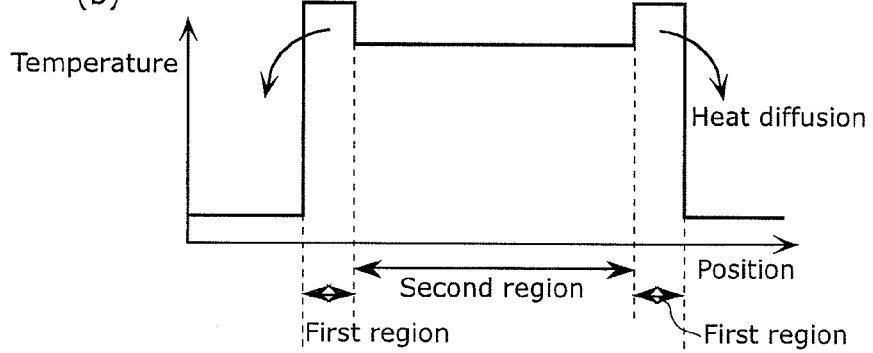
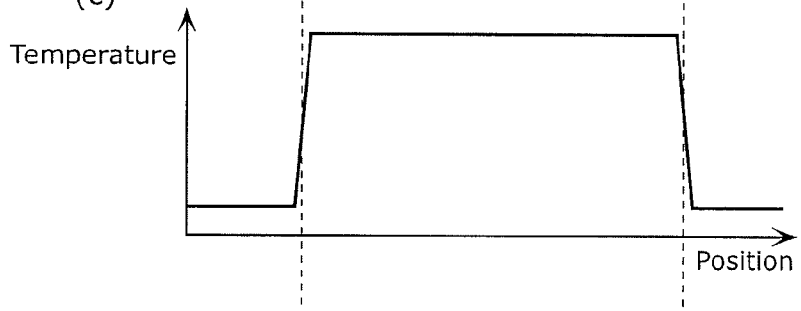
FIG. 5A
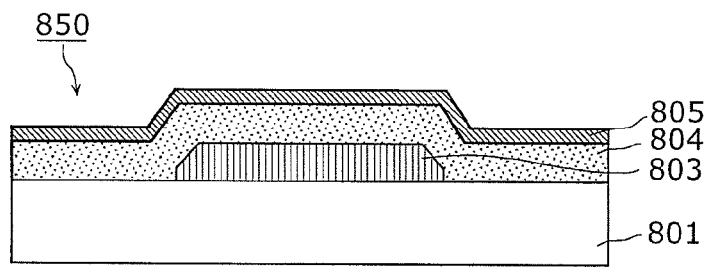

FIG. 8B
|  | n | k | Reflectivity |
|---|---|---|---|
| a-Si | 5.07 | 0.61 |  |
| SiO2 | 1.46 |  |  |
| SiN | 1.9 |  |  |
| Al | 0.867 | 6.42 | 0.922 |
| Cu | 1.04 | 2.59 | 0.617 |
| Mo | 3.79 | 3.3 | 0.579 |
Reflectivity Al > Cu > Mo
FIG. 9A
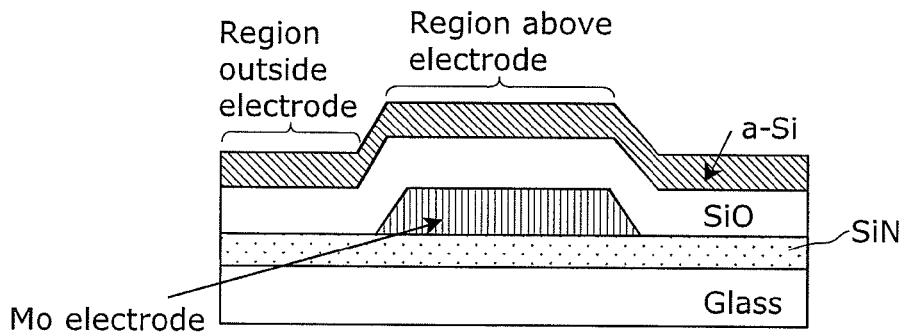
FIG. 9B
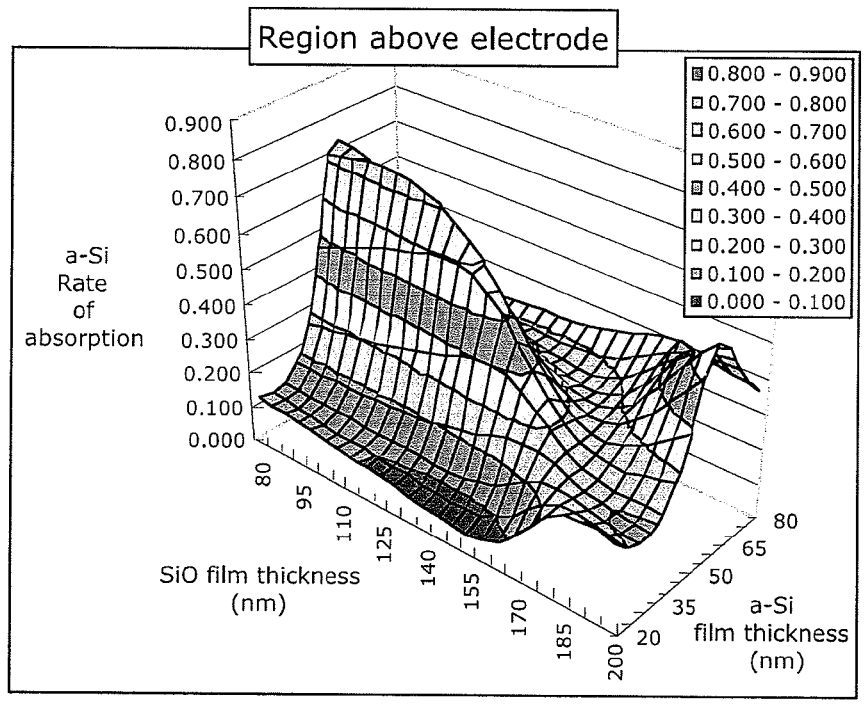

FIG. 13

| | |
|---|---|
| Mo / Cu include a-Si Reflectivity | 0.278 |
| Mo / Cu include SiOi Reflectivity | 0.838 |
| Mo Reflectivity | 0.579 |
| Cu include a-Si Reflectivity | 0.213 |
| Cu include SiO Reflectivity | 0.840 |
| Cu Reflectivity | 0.617 |
| Metal not include a-Si Reflectivity | 0.384 |
| Metal not include SiO Reflectivity | 0.315 |
| Metal not include SiN Reflectivity | 0.004 |

FIG. 14

| | Density (kg / m$^3$) | Specific heat (J / kg · K) | Thermal conductivity (W / m · K) |
|---|---|---|---|
| Mo | 10142.0 | 267 | 126 |
| Cu | 8776 | 408 | 382 |
| a-Si | 2340 | 890 | 2.13 |
| SiO | 2600 | 745 | 1.35 |

FIG. 15A

| ($\mu$m) | Specification 1 | Specification 2 | Specification 3 |
|---|---|---|---|
| d | 0 | 5 | 10 |
| A | 40 | 30 | 20 |
| B | 40 | 35 | 30 |

|  | x = 17.5 μm | x = 20 μm | Temperature difference (K) |
|---|---|---|---|
| Specification 1 | 1207.5 | 1003.2 | 204.3 |
| Specification 2 | 1242.5 | 1079.1 | 163.4 |
| Specification 3 | 1249.1 | 1077.5 | 171.6 |

METHOD OF CRYSTALLIZING SILICON THIN FILM AND METHOD OF MANUFACTURING SILICON THIN-FILM TRANSISTOR DEVICE

CROSS REFERENCE TO RELATED APPLICATION

This is a continuation application of PCT application No. PCT/JP2010/004110 filed on Jun. 21, 2010, designating the United States of America.

BACKGROUND OF THE INVENTION (1) Field of the Invention

The present invention relates to a technique of crystallizing an a-Si film using a laser beam in a silicon thin film having a bottom-gate structure.

(2) Description of the Related Art

There is, for example, a silicon thin-film transistor (TFT) device included in a liquid-crystal display device or an organic electroluminescence (EL) display device. A semiconductor layer (hereinafter referred to as silicon thin film) which is a channel portion of the silicon TFT device and which includes silicon, for example, is formed generally by non-crystalline (amorphous) or crystalline silicon thin film. It is preferable here that the silicon thin film that is the channel portion is formed of a crystalline silicon thin film that has a high mobility compared to amorphous silicon. Thus, in a manufacturing process, a noncrystalline silicon thin film included in the channel portion is formed and then the formed noncrystalline silicon thin film is crystallized, thereby forming a crystalline silicon thin film.

As a method of crystallizing the noncrystalline silicon thin film, there is, for example, a method of crystallizing with irradiation of a laser beam such as a green laser beam having a wavelength of 532 nm (see, for example, Non Patent Literature 1: 41.2: Micro Silicon Technology for Active Matrix OLED Display. [SID Symposium Digest of Technical Papers 38, 1370 (2007)]).

Non Patent Literature 1 discloses a technique with which, in a bottom-gate structure, an electrode in a bus line region is made to have an Mo and AlNd structure in two layers to be under a region not irradiated with a laser beam and an electrode under a region irradiated with the laser beam is made to be an Mo single layer.

SUMMARY OF THE INVENTION

In the bottom-gate silicon TFT, however, when crystallizing a noncrystalline silicon thin film using a green laser beam of 532 nm, for example, there is a problem of causing non-uniformity in a crystalline structure in the noncrystalline silicon thin film above the gate electrode.

The bottom-gate silicon TFT disclosed by Non Patent Literature 1 includes electrodes having different structures in a region irradiated with a laser beam and a region not irradiated with a laser beam; however, there is no suggestion of suppressing non-uniformity in the crystalline structure of the noncrystalline silicon thin film above the gate electrode, and thus non-uniformity in the crystalline structure cannot be suppressed.

The present invention has been conceived in view of the above-described problem and an object of the present invention is to provide a method of crystallizing a silicon thin film with which the size of a crystalline grain of the silicon thin film can be uniformed and a method of manufacturing a silicon TFT device.

In order to achieve the object described above, a method of crystallizing a silicon thin film according to an aspect of the present invention comprises: a first process of placing a substrate; a second process of stacking a first gate electrode on the substrate, the first gate electrode having a first reflectivity and a top face which is flat; a third process of stacking a second gate electrode on the first gate electrode such that a flat plane of a fringe portion in the top face of the first gate electrode is exposed, the second gate electrode having a second reflectivity lower than the first reflectivity and including a top face having an area smaller than an area of the top face of the first gate electrode; a fourth process of stacking a gate insulation film to cover (i) a fringe region of the substrate, in which the first gate electrode is not formed, (ii) a first region which is a flat plane of the fringe portion in the top face of the first gate electrode, and (iii) a second region that is the top face of the second gate electrode, the first region being not covered by the second gate electrode, a fifth process of stacking a silicon thin film on the stacked gate insulation film to cover the gate insulation film; and a sixth process of crystallizing the silicon thin film by irradiating the silicon thin film from above with a given laser beam, wherein in the sixth process, during the irradiation of the laser beam onto the silicon thin film, a temperature of the silicon thin film corresponding to the first region is higher than a temperature of the silicon thin film corresponding to the second region that is the top face of the second gate electrode because the first reflectivity is higher than the second reflectivity, the first region being not covered by the second gate electrode and being the flat plane of the fringe portion in the top face of the first gate electrode.

With the present invention, the method of crystallizing a silicon thin film with which the size of a crystalline grain of the silicon thin film can be uniformed and the method of manufacturing a silicon TFT device can be implemented. This makes it possible to suppress the non-uniformity in the crystalline structure.

FURTHER INFORMATION ABOUT TECHNICAL BACKGROUND TO THIS APPLICATION

The disclosure of PCT application No. PCT/JP2010/004110 filed on Jun. 21, 2010, including specification, drawings and claims is incorporated herein by reference in its entirety.

BRIEF DESCRIPTION OF THE DRAWINGS

These and other objects, advantages and features of the invention will become apparent from the following description thereof taken in conjunction with the accompanying drawings that illustrate a specific embodiment of the invention. In the Drawings:

FIG. 2 is a flowchart illustrating a manufacturing process of the silicon TFT device according to the embodiment of the present invention;

FIG. 3A is a diagram for explaining a manufacturing method of the silicon TFT device according to the embodiment of the present invention;

FIG. 3B is a diagram for explaining the manufacturing method of the silicon TFT device according to the embodiment of the present invention;

FIG. 4 is a diagram illustrating a configuration of a bottom-gate TFT and a temperature distribution at the time of irradiation with a laser beam according to the present embodiment;

FIG. 5A is a cross-sectional view schematically illustrating a configuration of a conventional bottom-gate TFT;

FIG. 8B is a table showing a parameter used for calculation in the example according to the present invention;

FIG. 9A is a diagram illustrating a model structure when Mo is used as the metal film shown in FIG. 8A;

FIG. 9B is a diagram illustrating a calculation result when the thickness of an a-Si film and the thickness of a SiO$_2$ film are changed in the model structure shown in FIG. 9A;

FIG. 13 is a diagram illustrating the model structure used for the calculation in the example;

FIG. 14 is a diagram illustrating the parameter used for the calculation in the example;

FIG. 15A is a diagram illustrating simulation conditions for a thermal analysis in the example;

DESCRIPTION OF THE PREFERRED EMBODIMENT

Figure 1:
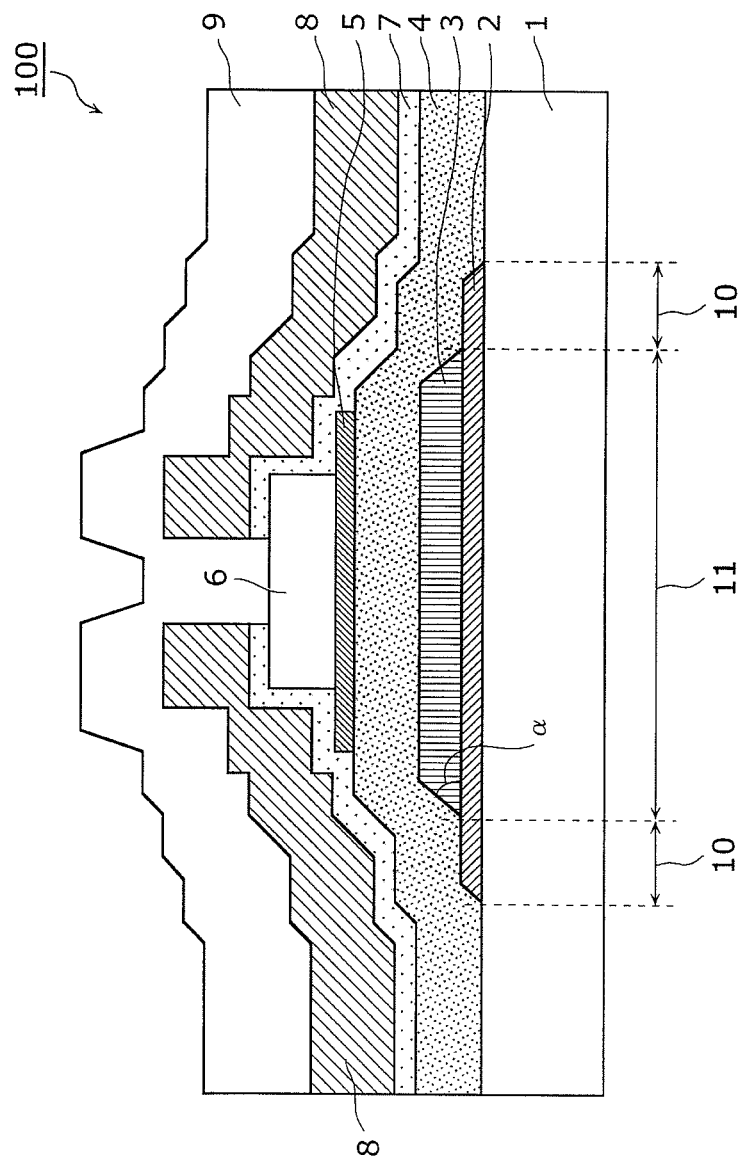
FIG. 1 is a cross-sectional view schematically illustrating a configuration of a silicon TFT device according to an embodiment of the present invention.

Although only an exemplary embodiment of this invention has been described in detail above, those skilled in the art will readily appreciate that many modifications are possible in the exemplary embodiment without materially departing from the novel teachings and advantages of this invention. Accordingly, all such modifications are intended to be included within the scope of this invention.

A method of crystallizing a silicon thin film according to a first aspect of the present invention comprises: a first process of placing a substrate; a second process of stacking a first gate electrode on the substrate, the first gate electrode having a first reflectivity; a third process of stacking a second gate electrode on the first gate electrode such that a fringe portion in the top face of the first gate electrode is exposed, the second gate electrode having a second reflectivity lower than the first reflectivity and including a top face having an area smaller than an area of the top face of the first gate electrode; a fourth process of stacking a gate insulation film to cover (i) a fringe region of the substrate, in which the first gate electrode is not formed, (ii) a first region above the first gate electrode, and (iii) a second region that is the top face of the second gate electrode, the first region being not covered by the second gate electrode, a fifth process of stacking a silicon thin film on the stacked gate insulation film to cover the gate insulation film; and a sixth process of crystallizing the silicon thin film by irradiating the silicon thin film from above with a given laser beam, wherein in the sixth process, during the irradiation of the laser beam onto the silicon thin film, a temperature of the silicon thin film corresponding to the first region is higher than a temperature of the silicon thin film corresponding to the second region because the first reflectivity is higher than the second reflectivity.

According to the above-described aspect, the first gate electrode having the first reflectivity is stacked on the substrate and the second gate electrode having the second reflectivity that is lower than the first reflectivity and a top face area smaller than a top face area of the first gate electrode is stacked on the first gate electrode such that a fringe portion of the top face of the first gate electrode is exposed. In crystallizing the silicon thin film by irradiating the silicon thin film with the laser beam, the temperature of the silicon thin film corresponding to the first region is higher than the temperature of the silicon thin film corresponding to the second region because the first reflectivity is higher than the second reflectivity.

With the above configuration, it is possible to set the temperature of the silicon thin film corresponding to the second gate electrode higher than the temperature of the silicon thin film corresponding to the first gate electrode that is present in an outer circumference of the second gate electrode in crystallizing the silicon thin film by irradiating the silicon thin film with a given laser beam, thereby preventing the temperature of the silicon thin film corresponding to the both end portions of the second gate electrode from diffusing from a region corresponding to the second gate electrode into a region corresponding to outside a region in which the second gate electrode is formed.

As a result, the crystalline grain size in the silicon thin film corresponding to the second gate electrode becomes substantially uniform, and thus it is possible to implement the method of crystallizing a silicon thin film, which allows the size of the crystalline grain of the silicon thin film after crystallization to be uniform in the center region and the fringe region of the channel region.

In the method of crystallizing a silicon thin film according to a second aspect of the present invention, in the sixth process, the temperature of the silicon thin film corresponding to the first region becomes higher than the temperature of the silicon thin film corresponding to the second region, during the irradiation of the laser beam onto the silicon thin film, and the temperature of the silicon thin film corresponding to the first region becomes substantially the same as the temperature of the silicon thin film corresponding to the second region, after the silicon thin film is irradiated with the laser beam, so that the silicon thin film corresponding to the first region and the silicon thin film corresponding to the second region crystallize.

According to the above-described aspect, the temperature of the silicon thin film corresponding to the first region becomes higher than the temperature of the silicon thin film corresponding to the second region during the irradiation of the laser beam onto the silicon thin film. On the other hand, the temperature of the silicon thin film corresponding to the first region and the temperature of the silicon thin film corresponding to the second region become substantially the same after the silicon thin film is irradiated with the laser beam. And in this state, the silicon thin film corresponding to the first region and the silicon thin film corresponding to the second region are crystallized.

With this, the crystalline grain size in the silicon thin film corresponding to the second gate electrode becomes further uniformed, and thus it is possible to implement the method of crystallizing a silicon thin film, which allows the size of the crystalline grain of the silicon thin film after crystallization to be uniform in the center region and the fringe region of the channel region.

In the method of crystallizing a silicon thin film according to a third aspect of the present invention, in the sixth process, the silicon thin film corresponding to the first region and the silicon thin film corresponding to the second region are concurrently irradiated with the laser beam.

According to the above-described aspect, in crystallizing the silicon thin film by irradiating the silicon thin film with the laser beam, the silicon thin film corresponding to the first region and the silicon thin film corresponding to the second region are concurrently irradiated with the given laser beam.

With this, the temperature of the silicon thin film corresponding to the first region and the temperature of the silicon thin film corresponding to the second region increase concurrently, and thus it is possible to set a higher temperature in the silicon thin film corresponding to the second region than a temperature in the silicon thin film corresponding to the first region.

As a result, it is possible to further prevent the temperature of the silicon thin film corresponding to the both end portions of the second gate electrode from diffusing from the region corresponding to the second gate electrode to the region corresponding to outside the region in which the second gate electrode is formed.

With this, it is possible to implement the method of crystallizing a silicon thin film, which allows the size of the crystalline grain of the silicon thin film to be uniform.

In the method of crystallizing a silicon thin film according to a fourth aspect of the present invention, a crystalline grain size in the silicon thin film corresponding to the second region is substantially uniform due to a relationship between the first reflectivity and the second reflectivity.

According to the above-described aspect, it is possible to set the crystalline grain size in the silicon thin film corresponding to the second region as being substantially the same, due to the relationship between the first reflectivity and the second reflectivity.

In the method of crystallizing a silicon thin film according to a fifth aspect of the present invention, the given laser beam has a wavelength in a range of 405 nm to 632 nm.

According to the above-described aspect, it is possible to set the given laser beam as having a wavelength in a range of 405 nm to 632 nm.

In the method of crystallizing a silicon thin film according to a sixth aspect of the present invention, the given laser beam is a green laser beam.

According to the above-described aspect, it is possible to use a green laser beam as the given laser beam.

In the method of crystallizing a silicon thin film according to a seventh aspect of the present invention, the given laser beam is a blue laser beam.

According to the above-described aspect, it is possible to use a blue laser beam as the given laser beam.

In the method of crystallizing a silicon thin film according to an eighth aspect of the present invention, an end portion of the second gate electrode has a predetermined inclination angle.

In the manufacturing process, a slanted plane is formed in the end portion of the gate electrode. A reflected light of the predetermined laser beam is diffused in this slanted plane, which causes decrease in the temperature at the time of crystallizing the silicon thin film corresponding to the slanted plane of the gate electrode.

According to the above-described aspect, it is possible, even in such a case, to set a higher temperature in the silicon thin film corresponding to the first region than the temperature in the silicon thin film corresponding to the second region because the first reflectivity is higher than the second reflectivity, in crystallizing the silicon thin film by irradiating the silicon thin film with the laser beam. This prevents the temperature of the silicon thin film corresponding to the both end portions of the second gate electrode from diffusing from the region corresponding to the second gate electrode to the region corresponding to outside the region in which the second gate electrode is formed.

As a result, the crystalline grain size in the silicon thin film corresponding to the second gate electrode becomes substantially uniform, and thus it is possible to implement a method of crystallizing a silicon thin film, which allows the size of the crystalline grain of the silicon thin film after crystallization to be uniform in the center region and the fringe region of the channel region.

In the method of crystallizing a silicon thin film according to a ninth aspect of the present invention, a laser beam intensity profile of the laser beam is flat at least in the first region and in the second region.

According to the above-described aspect, the laser beam intensity profile of the laser beam is flat at least in the first region and in the second region in the sixth process.

This facilitates setting the temperature of the silicon thin film in the first region higher than the temperature of the silicon thin film corresponding to the second region, when crystallizing the silicon thin film by irradiating, with the laser beam, the silicon thin film and an insulation film which suppresses the rate of light absorption of the silicon thin film to be within a predetermined range.

As a result, the crystalline grain size in the silicon thin film corresponding to the second gate electrode becomes further uniform, and thus it is possible to implement the method of crystallizing a silicon thin film, which allows the size of the crystalline grain of the silicon thin film after crystallization to be uniform in the center region and the fringe region of the channel region.

A method of manufacturing a silicon thin-film transistor (TFT) device according to a tenth aspect of the present invention comprises: the first process to the sixth process according to the first aspect; a seventh process of forming source and drain electrodes on (i) an end portion of a top face and a side face of an insulation film formed on part of the crystallized silicon thin film and (ii) a top face of the crystallized silicon thin film, the seventh process being performed after the sixth process; and an eighth process of forming a passivation film on the insulation film and the source and drain electrodes.

According to the above-described aspect, it is possible to manufacture the silicon TFT device which includes the crystalline silicon thin film which is crystallized by the method of crystallizing a silicon thin film according to one of the first aspect to the ninth aspect.

The method of manufacturing a silicon thin-film transistor (TFT) device according to an eleventh aspect of the present invention comprises: a process of forming a contact layer on (i) the end portion of the top face and the side face of the insulation film and (ii) the top face of the crystallized silicon thin film, the process of forming a contact layer being performed between the sixth process and the seventh process.

In the above-described aspect, a process of forming a contact layer on (i) the end portion of the top face and the side face of the insulation film and (ii) the top face of the crystallized silicon thin film is included between the sixth process and the seventh process.

With this, it is possible to implement a method of manufacturing the silicon TFT device having excellent mobility and on/off characteristic.

Embodiment

The FIG. 1 is a cross-sectional view schematically illustrating a configuration of a silicon TFT device according to an embodiment of the present invention. A silicon TFT device 100 in the diagram is a thin-film transistor device of a bottom-gate type, and includes: a first gate electrode 2; a second gate electrode 3; a gate insulation film 4; a crystalline silicon thin film 5; an insulation film 6; a pair of contact layers 7; a pair of source and drain electrodes 8; and a passivation film 9, which are sequentially stacked on a substrate 1.

The substrate 1 is a substrate formed of a transparent glass or quartz, for example.

The first gate electrode 2 includes, for example, a metal such as Cu (copper), Al (aluminum), and the like, or an alloy including Cu (copper), Al (aluminum), and the like, and is formed on the substrate 1 to have a thickness of 50 nm, for example. The first gate electrode 2 has a first reflectivity of a metal included in the first gate electrode 2.

The second gate electrode 3 is stacked on the first gate electrode 2 to have a thickness of 50 nm, for example, with a fringe portion on a top face of the first gate electrode 2 being exposed, such that the second gate electrode 3 has a smaller area than the first gate electrode 2. The second gate electrode 3 includes a metal such as Mo (molybdenum), Cu (copper), and the like, or an alloy including Mo (molybdenum), Cu (copper), and the like, and has a second reflectivity of a metal included in the second gate electrode 3. The second reflectivity is lower than the first reflectivity. More specifically, the second gate electrode 3 has the second reflectivity lower than the first reflectivity and has a top face area smaller than a top face area of the first gate electrode 2. In addition, an end portion of the second gate electrode 3 has a predetermined angle α shown in FIG. 1. The predetermined angle α is an internal angle of the second gate electrode 3 in contact with the first gate electrode 2 and is, for example, 70° to 90°. The reason for the above is that a slanted plane (taper) is formed in the end portion of the second gate electrode 3 in a manufacturing process and reflected light of a laser beam is diffused depending on the angle of the formed slanted plane, and this causes a decrease in the temperature at the time of crystallization in the noncrystalline silicon thin film 5a that corresponds to the slanted plane (taper) of the end portion of the second gate electrode. In view of the above, the angle α of the taper is set at 70° to 90°, for example, thereby suppressing the effect of the decrease in the temperature at the time of crystallization in the noncrystalline silicon thin film 5a corresponding to the slanted plane (taper).

It is to be noted that each of the first gate electrode 2 and the second gate electrode 3 includes a combination of metals, such as Cu and Mo, Al and Cu, Al and Mo, and the like. In addition, the relationship between the metal material of the first gate electrode and the second gate electrode; that is, the relationship between the first reflectivity and the second reflectivity, is determined such that a crystalline grain size in the noncrystalline silicon thin film 5a that corresponds to the second region is substantially the same.

The gate insulation film 4 includes, for example, silicon oxide (SiO), silicon nitride (SiN), a laminated film thereof, or the like, and is formed on or above the substrate 1, the first gate electrode 2, and the second gate electrode 3 such that the gate insulation film 4 covers the first gate electrode 2 and the second gate electrode 3. The gate insulation film 4 is formed to have a thickness of 120 nm, for example.

More specifically, the gate insulation film 4 covers a fringe region of the substrate 1 on which the first gate electrode 2 is not formed, a first region on the first gate electrode 2 which is not covered by the second gate electrode 3, and a second region that is the top face of the second gate electrode 3, and is stacked in the same shape as the shape of the stacked substrate 1, the first gate electrode 2, and the second gate electrode 3.

The crystalline silicon thin film 5 is stacked in the same shape as the shape of the gate insulation film 4, on the gate insulation film 4 that is stacked in the same shape as the above-described shape. More specifically, a noncrystalline silicon thin film 5a (not illustrated) which is stacked on the gate insulation film 4 and includes such as a-Si is irradiated with, for example, a green laser beam from above to be a polycrystal (including a microcrystal), thereby forming the crystalline silicon thin film 5. It is to be noted here that the term "polycrystal" is used in wide definition including "microcrystal" in narrow definition of a crystal having an average grain size of 50 nm or smaller, more specifically 20 nm to 50 nm, for example, in addition to "polycrystal" in narrow definition of a crystal having an average grain size of 50 nm or larger. The term "polycrystal" is hereafter used in the wide definition.

It is to be noted that, when irradiating, with a laser beam, the noncrystalline silicon thin film 5a stacked on the gate insulation film 4, since the first reflectivity is higher than the second reflectivity, it is possible to set the temperature of the noncrystalline silicon thin film 5a corresponding to the first region higher than the temperature of the noncrystalline silicon thin film 5a corresponding to the second region. This can prevent the temperature of the noncrystalline silicon thin film 5a corresponding to both end portions of the second gate electrode 3 from diffusing from the region corresponding to the second gate electrode 3 to the region corresponding to outside the region in which the second gate electrode 3 is formed. As a result, the noncrystalline silicon thin film 5a is crystallized. As a result, since the crystalline grain size in the crystalline silicon thin film 5a corresponding to the second gate electrode 3 is substantially uniformed, the crystalline grain size in the crystalline silicon thin film 5a of the center region and the fringe region of the channel region after crystallization is uniformed.

In addition, the thickness of the crystalline silicon thin film 5 is, for example, 40 nm; however the thickness is not limited to this. It is only necessary for the thickness to satisfy the following 1) and 2), and the reason will be described later.

1) in the case where 180 nm<the thickness of the gate insulation film 4<200 nm, 30 nm<the thickness of crystalline silicon thin film 5<40 nm 2) in the case where 100 nm<the thickness of the gate insulation film 4<180 nm, the thickness of crystalline silicon thin film 5<30 nm, and the thickness of crystalline silicon thin film 5<(−⅓×the thickness of the gate insulation film 4+100 nm)

The insulation film 6 includes, for example, silicon oxide (SiO), silicon nitride (SiN), and the like, and is formed on part of the top face of the crystalline silicon thin film 5. The insulation film 6 serves as a channel etching stopper (CES) layer which suppresses etching of the crystalline silicon thin film 5 when the contact layers 7 is formed through etching.

Here, the width of the insulation film 6 is narrower than the width of the top face of the crystalline silicon thin film 5. Here, the width of the insulation film 6 and the width of the top face of the crystalline silicon thin film 5 correspond to the width in the direction of alignment of the source and drain electrodes 8; that is, the width in the direction of conduction of channel charge.

The contact layers 7 are doped semiconductor layers including, for example, silicon and the like, and having a conduction form of dopant concentration higher than that of the crystalline silicon thin film 5, and formed as being spaced from each other to cover the insulation film 6, the crystalline silicon thin film 5, and the gate insulation film 4.

The source and drain electrodes 8 are formed on the contact layers 7. More specifically, the source and drain electrodes 8 are formed as being spaced from each other, on end portions of a top face and side faces of the insulation film 6 and the top face of the crystalline silicon thin film 5 with the contact layers 7 being interposed. Each of the source and drain electrodes 8 is, for example, a single-layer structure or multilayer structure that is made of a conductive material, an alloy, or the like, and includes, for example, aluminum (Al), molybdenum (Mo), copper (Cu), molybdenumtungsten (MoW), titanium (Ti), and chromium (Cr).

The passivation film 9 includes, for example, silicon oxide (SiO), silicon nitride (SiN), and the like, and is formed on an exposed portion of the insulation film 6 and on the source and drain electrodes 8.

Next, a method of manufacturing the silicon TFT device 100 configured as described above shall be described.

FIG. 2 is a flowchart illustrating a manufacturing process of the silicon TFT device 100 according to the embodiment of the present invention. FIG. 3A to FIG. 3J are diagrams for explaining the manufacturing process of the silicon TFT device 100 according to the embodiment of the present invention.

First, as shown in FIG. 3A, the substrate 1 is placed (S1).

Next, a process of stacking the first gate electrode is performed in which the first gate electrode 2 having the first reflectivity is stacked (S2). Then a process of stacking the second gate electrode is performed in which the second gate electrode 3 having the second reflectivity that is lower than the first reflectivity and a top face area smaller than a top face area of the first gate electrode 2 is stacked on the first gate electrode 2 such that a fringe portion of the top face of the first gate electrode 2 is exposed (S3).

Figure 3C:
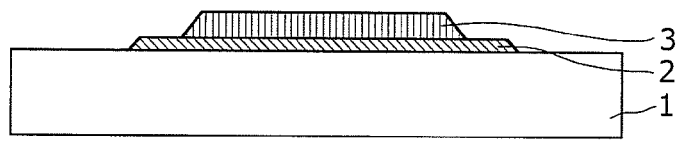
FIG. 3C is a diagram for explaining the manufacturing method of the silicon TFT device according to the embodiment of the present invention.

More specifically, a metal which has the first reflectivity and becomes the first gate electrode 2 is stacked by sputtering, and a metal which has the second reflectivity and becomes the second gate electrode 3 is further stacked (FIG. 3B). Next, the first gate electrode 2 and the second gate electrode 3 on which patterning is performed by photolithography and etching to be a desired shape are formed (FIG. 3C). More specifically, as shown in FIG. 3C, the second gate electrode 3 is formed on the first gate electrode 2 such that the second gate electrode 3 has a smaller top face area than a top face area of the first gate electrode 2 and the fringe portion of the top face of the first gate electrode 2 is exposed (FIG. 3C). Here, each of the first gate electrode 2 and the second gate electrode 3 includes a combination of metals, such as Cu and Mo, Al and Cu, Al and Mo, and the like.

Figure 3D:
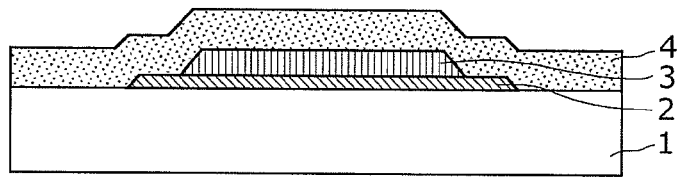
FIG. 3D is a diagram for explaining the manufacturing method of the silicon TFT device according to the embodiment of the present invention.

Next, a process of stacking a gate insulation film is performed in which the gate insulation film 4 is stacked in the same shape as the shape of the stacked substrate 1, the first gate electrode 2, and the second gate electrode 3 to cover the fringe region of the substrate 1 in which the first gate electrode 2 is not formed, the first region of the first gate electrode 2 which is not covered by the second gate electrode 3, and the second region of the top face of the second gate electrode 3 (S4). More specifically, the gate insulation film 4 is formed by plasma CVD and the like to cover the exposed portion (fringe region) of the substrate 1, the exposed portion (first region) of the first gate electrode 2, and the top face (second region) of the second gate electrode 3 (FIG. 3D).

Next, a process of stacking a silicon thin film is performed in which the crystalline silicon thin film 5 is stacked in the same shape as the shape of the gate insulation film 4, on the gate insulation film 4 that is stacked in the same shape as the above-described shape (S5).

Figure 3E:
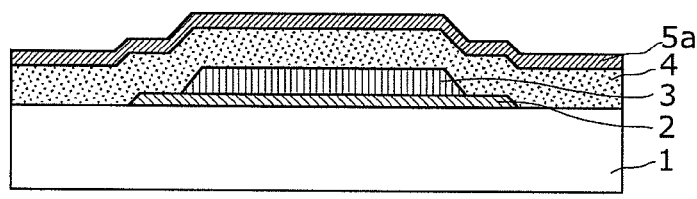
FIG. 3E is a diagram for explaining the manufacturing method of the silicon TFT device according to the embodiment of the present invention.
Figure 3F:
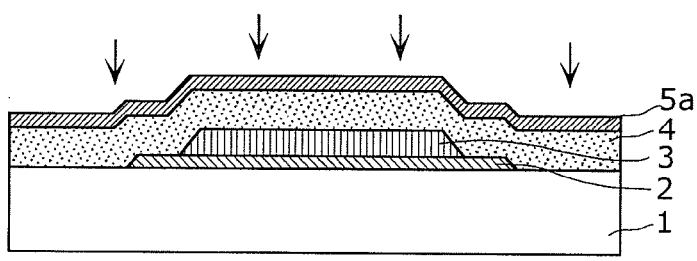
FIG. 3F is a diagram for explaining the manufacturing method of the silicon TFT device according to the embodiment of the present invention.

More specifically, the gate insulation film 4 is first formed by the plasma CVD and the like, and consecutively the noncrystalline silicon thin film 5a is formed on the previously-formed gate insulation film 4 (FIG. 3E). Here, the gate insulation film 4 includes, for example, silicon oxide (SiO), silicon nitride (SiN), a laminated film thereof, or the like, as described above.

Next, a process of crystallizing a silicon thin film is performed in which the formed noncrystalline silicon thin film 5a is irradiated with a predetermined laser beam from above to be crystallized (S6).

Figure 3G:
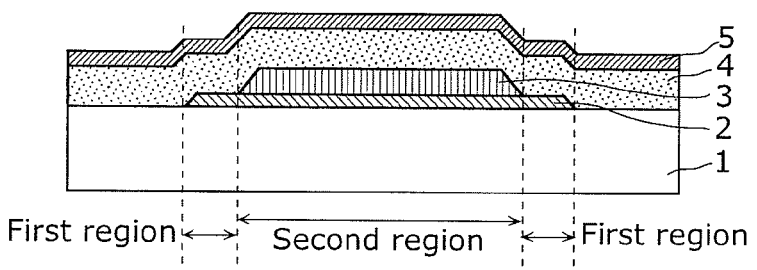
FIG. 3G is a diagram for explaining the manufacturing method of the silicon TFT device according to the embodiment of the present invention.

To be specific, the crystalline silicon thin film 5 is formed by performing laser annealing on the noncrystalline silicon thin film 5a, in Step S6. To be more specific, the noncrystalline silicon thin film 5a is irradiated with a laser beam from above (FIG. 3F) to be a polycrystal (also including a microcrystal), thereby forming the crystalline silicon thin film 5 (FIG. 3G). It is to be noted that the conditions for the laser beam and the like will be descried later, and thus the description is omitted here.

Next, a process of forming a contact layer is performed in which the contact layer 7 including a doped semiconductor layer is formed on the end portions of the top face and the side faces of the insulation film 6 and the top face of the crystalline silicon thin film 5 (S7). Then, a process of forming source and drain electrodes is performed in which the source and drain electrodes are formed above the gate insulation film 4 and the crystalline silicon thin film 5 with the contact layer 7 being interposed (S8).

Figure 3H:
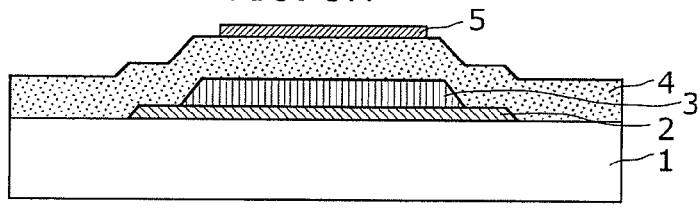
FIG. 3H is a diagram for explaining the manufacturing method of the silicon TFT device according to the embodiment of the present invention.
Figure 3I:
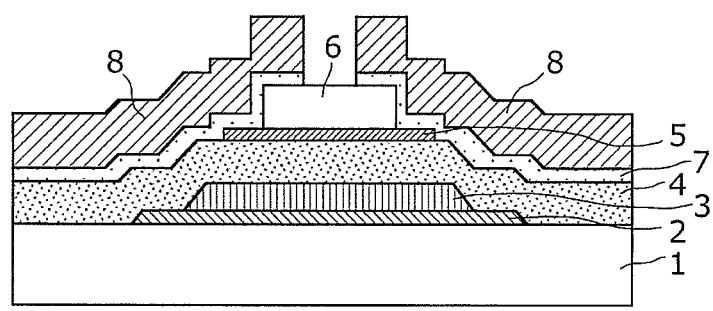
FIG. 3I is a diagram for explaining the manufacturing method of the silicon TFT device according to the embodiment of the present invention.

More specifically, a channel region is formed by patterning the crystalline silicon thin film 5 through photolithography and etching to leave a portion of the crystalline silicon thin film 5 to be the channel region (FIG. 3H). Next, the insulation film 6 having a width narrower than the width of the top face of the crystalline silicon thin film 5 is formed on the crystalline silicon thin film 5 by plasma CVD, for example. Then, the contact layers 7 including a N+silicon film doped with P (phosphorus), for example, is formed by the plasma CVD or the like such that the contact layer 7 covers the gate insulation film 4, the crystalline silicon thin film 5, and the insulation film 6. Then a metal which will become the source and drain electrodes 8 are deposited by the sputtering or the like, on the formed contact layer 7. Here, the source and drain electrodes are formed of a material of a metal such as molybdenum (Mo), Mo alloy, or the like, a metal such as titanium (Ti), aluminum (Al), Al alloy, or the like, a metal such as copper (Cu), Cu alloy, or the like, or a metal such as silver (Ag), chromium (Cr), tantalum (Ta), tungsten (W), or the like. Next, a resist is formed on the metal which will be the source and drain electrodes 8 such that the center region of the top face of the insulation film 6 is exposed, and the source and drain electrodes 8 are formed by dry etching using the resist as a mask (FIG. 3I). More specifically, the insulation film 6 serves as a channel etching stopper (CES), and thus it is possible to form the source and drain electrodes 8 as being spaced from each other, above the end portions of the top face and the side faces of the insulation film 6 and the top face of the crystalline silicon thin film 5 with the contact layers 7 being interposed.

Lastly, a process of forming a passivation film in which a passivation film is formed on the exposed portion of the insulation film 6 and the source and drain electrodes 8 (S9).

Figure 3J:
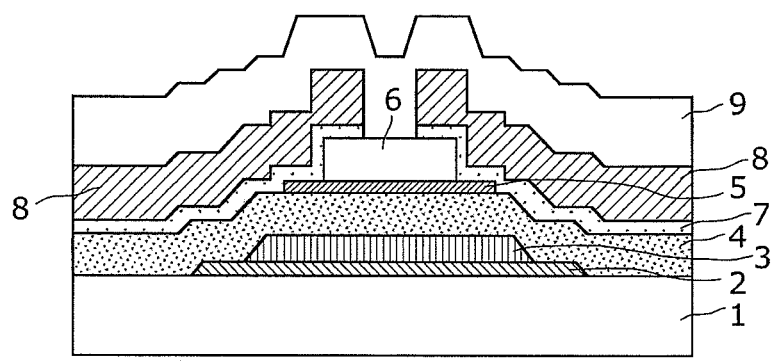
FIG. 3J is a diagram for explaining the manufacturing method of the silicon TFT device according to the embodiment of the present invention.

More specifically, the passivation film 9 including silicon oxide (SiO) or silicon nitride (SiN) is formed on the exposed portion of the insulation film 6 and on the source and drain electrodes 8 by the plasma CVD or the like (FIG. 3J).

Through the processed described above, it is possible to implement a method of manufacturing the silicon TFT device 100 having excellent mobility an on/off characteristic.

Here, the process of crystallizing a silicon thin film (S6) which is a characteristic manufacturing process of the silicon TFT device 100 will be described in detail with reference to FIG. 4.

FIG. 4 is a diagram illustrating a configuration of a bottom-gate TFT and a temperature distribution at the time of irradiation with a laser beam according to the present embodiment. (a) in FIG. 4 is a diagram illustrating the noncrystalline silicon thin film 5a being irradiated with a laser beam, in the process of crystallizing a silicon thin film (S6). (b) and (c) in FIG. 4 are diagrams illustrating the temperature distribution of the noncrystalline silicon thin film 5a when laser irradiation is performed. It is to be noted that the first region is, in FIG. 4, a region above the first gate electrode 2 which is not covered by the second gate electrode 3, as described above. The second region is a region on the first gate electrode 2. In addition, the third region is a region outside the region in which the second gate electrode 3 is formed.

As shown in (a) in FIG. 4, the noncrystalline silicon thin film 5a is irradiated with a laser beam, in the process of crystallizing a silicon thin film (S6). During the process, as shown in (b) in FIG. 4, since the first reflectivity of the first gate electrode 2 is higher than the second reflectivity of the second gate electrode, the temperature in the region of the noncrystalline silicon thin film 5a which corresponds to the first region becomes higher than the temperature in the region of the noncrystalline silicon thin film 5a which corresponds to the second region. Next, as shown in (c) in FIG. 4, after the noncrystalline silicon thin film 5a is irradiated with a laser beam, the temperature in the region of the noncrystalline silicon thin film 5a which corresponds to the first region and the temperature in the region of the noncrystalline silicon thin film 5a which corresponds to the second region become substantially the same. With the temperature distribution described above, the region of the noncrystalline silicon thin film 5a which corresponds to the first region and the region of the noncrystalline silicon thin film 5a which corresponds to the second region are crystallized.

As described above, not only the first gate electrode 2 and the second gate electrode 3 each having different reflectivity, but also the first region is formed by partially exposing, from the second gate electrode 3, the first gate electrode 2 having higher reflectivity. Then, irradiating the noncrystalline silicon thin film 5a with a laser beam allows forming, in the first region, a region having a higher temperature distribution than that of the second region, and thus it is possible to alleviate the difference between the temperature above the gate electrode (first gate electrode 2 and the second gate electrode 3) and the temperature outside the gate electrode, by utilizing heat diffusion. This makes it possible to uniform the crystalline grain size of the crystalline silicon thin film 5 that corresponds to the region above the gate electrode (first gate electrode 2 and the second gate electrode 3).

Here, it is preferable that the laser beam used in the process of crystallizing a silicon thin film is a laser beam whose wavelength is within a range of 405 nm to 632 nm. This laser beam may be a laser beam of green laser or may be a laser beam of a blue laser. In addition, light intensity profile of the laser beam is flat at least in the first region and in the second region, in the process of crystallizing a silicon thin film. Preferably, the light intensity profile of the laser beam has a light intensity distribution of Gaussian type in a short axis and a light intensity distribution of flat top type in a long axis, in the process of crystallizing a silicon thin film.

Use of such a laser beam facilitates setting a higher temperature in the noncrystalline silicon thin film 5a corresponding to the first region than in the noncrystalline silicon thin film 5a corresponding to the second region, in crystallizing the noncrystalline silicon thin film 5a in the process of crystallizing a silicon thin film. As a result, the crystalline grain size is further uniformed in the crystalline silicon thin film 5 that corresponds to the gate electrode; that is, the first gate electrode 2 and the second gate electrode 3. More specifically, the crystalline grain size in the crystalline silicon thin film 5a of the center region and the fringe region of the channel region is uniformed.

In addition, it is preferable that the noncrystalline silicon thin film 5a corresponding to the first region and the noncrystalline silicon thin film 5a corresponding to the second region are irradiated at the same time with the laser beam, in the process of crystallizing a silicon thin film. More specifically, it is preferable that the noncrystalline silicon thin film 5a corresponding to the first region and the noncrystalline silicon thin film 5a corresponding to the second region are irradiated at the same time vertically with respect to a scanning direction and continuously in the scanning direction, with the flat top portion (line beam) of the long axis of the laser beam.

Irradiation with the laser beam as described above increases, on the beam line, the temperature of the noncrystalline silicon thin film 5a corresponding to the first region and the temperature of the noncrystalline silicon thin film 5a corresponding to the second region at the same time. Thus, it is possible to set a higher temperature in the noncrystalline silicon thin film 5a corresponding to the second region than in the noncrystalline silicon thin film 5a corresponding to the first region during the irradiation of the laser beam as shown in (b) in FIG. 4. As a result, it is possible to further prevent the temperature of the noncrystalline silicon thin film 5a corresponding to both end portions of the second gate electrode 3 from diffusing from the region corresponding to the second gate electrode 3 to the region corresponding to outside the region in which the second gate electrode 3 is formed (denoted as the third region in the diagram).

The following describes the reason for performing the process of crystallizing a silicon thin film (S6) by forming the first gate electrode 2 and the second gate electrode 3 as shown in (a) in FIG. 4.

Figure 5B:
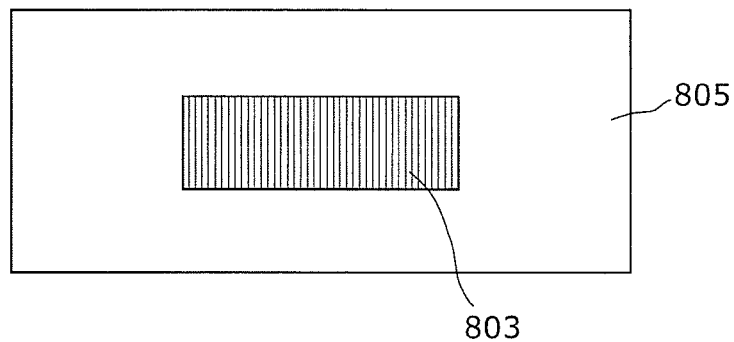
FIG. 5B is a top view schematically illustrating a configuration of the conventional bottom-gate TFT.

FIG. 5A is a cross-sectional view schematically illustrating a configuration of a conventional bottom-gate TFT. FIG. 5B is a top view schematically illustrating a configuration of the conventional bottom-gate TFT.

A bottom-gate silicon TFT device 850 shown in FIG. 5A includes: a substrate 801; a gate electrode 803; an insulation film 804; and a noncrystalline silicon thin film 805. Here, regions corresponding to the first region and the second region described above are shown in FIG. 5A. More specifically, the second region in FIG. 5A corresponds to the region above the gate electrode 803 and the first region corresponds to the region outside the gate electrode 803 and the fringe region of the gate electrode 803.

Here, in the bottom-gate silicon TFT device 850, the noncrystalline silicon thin film 805 which will be a channel layer is irradiated with a laser beam from above to crystallize the noncrystalline silicon thin film 805, and a crystalline state of the crystallized crystalline silicon thin film is observed with a microscope.

Figure 6A:
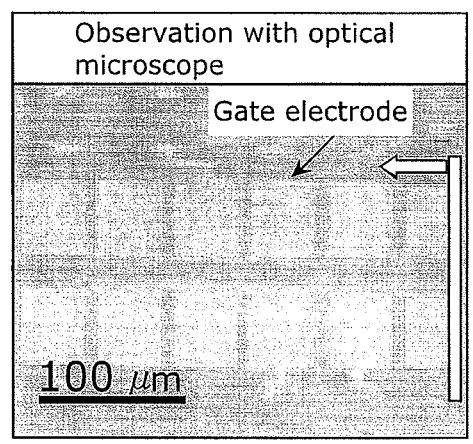
FIG. 6A is a diagram illustrating a crystalline state of a crystalline silicon thin film observed with an optical microscope.
Figure 6B:
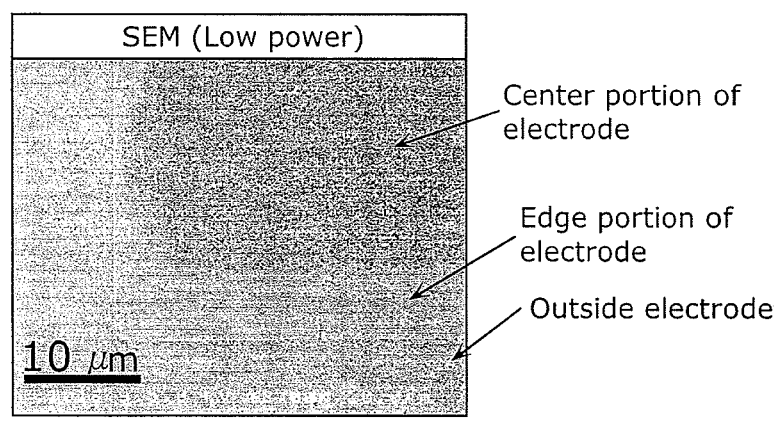
FIG. 6B is a diagram illustrating the crystalline silicon thin film observed with an electron microscope.
Figure 6C:
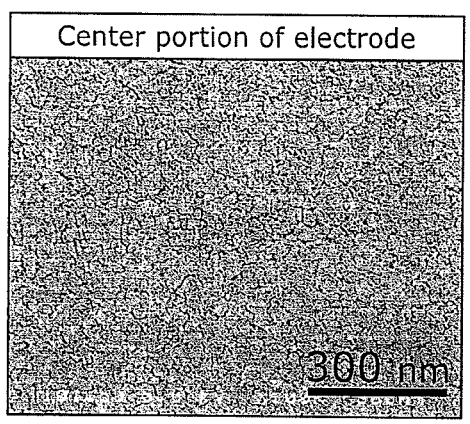
FIG. 6C is a diagram illustrating the crystalline silicon thin film observed with the electron microscope.
Figure 6D:
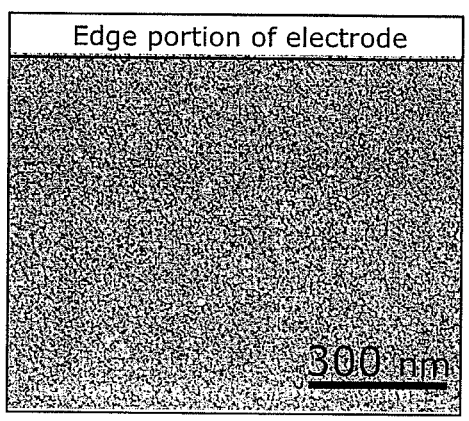
FIG. 6D is a diagram illustrating the crystalline silicon thin film observed with the electron microscope.

FIG. 6A is a diagram illustrating a crystalline state of a crystalline silicon thin film observed with an optical microscope. FIG. 6B to FIG. 6D are diagrams illustrating the crystalline silicon thin film observed with an electron microscope.

FIG. 6B is a diagram illustrating an observation of an edge (terminal portion) of the gate electrode 803 by a scanning electron microscope (SEM) of 3000 times power with an accelerating voltage being 5.0 kV. As shown in FIG. 6B, non-uniformity can be seen from the center portion to the edge portion of the gate electrode 803.

FIG. 6C is a diagram illustrating an observation of the center portion of the gate electrode 803 by the SEM of 100000 times power with the accelerating voltage being 5.0 kV, and FIG. 6D is a diagram illustrating an observation of the center portion of the gate electrode 803 by the SEM of 100000 times power with the accelerating voltage being 5.0 kV.

Comparison between FIG. 6C and FIG. 6D shows that the size of the formed crystalline grains is different between the crystalline silicon thin film corresponding to the center of the gate electrode 803 and the crystalline silicon thin film corresponding to the end portion (edge portion) of the gate electrode 803. More specifically, non-uniformity of the crystalline grain size is caused in the crystalline silicon thin film above the gate electrode 803, and uniformity is poor in a plane of the crystalline silicon thin film in a conventional bottom-gate TFT.

The following describes a mechanism of causing non-uniformity of the crystalline grain size in the crystalline silicon thin film above the gate electrode 803.

Figure 7:
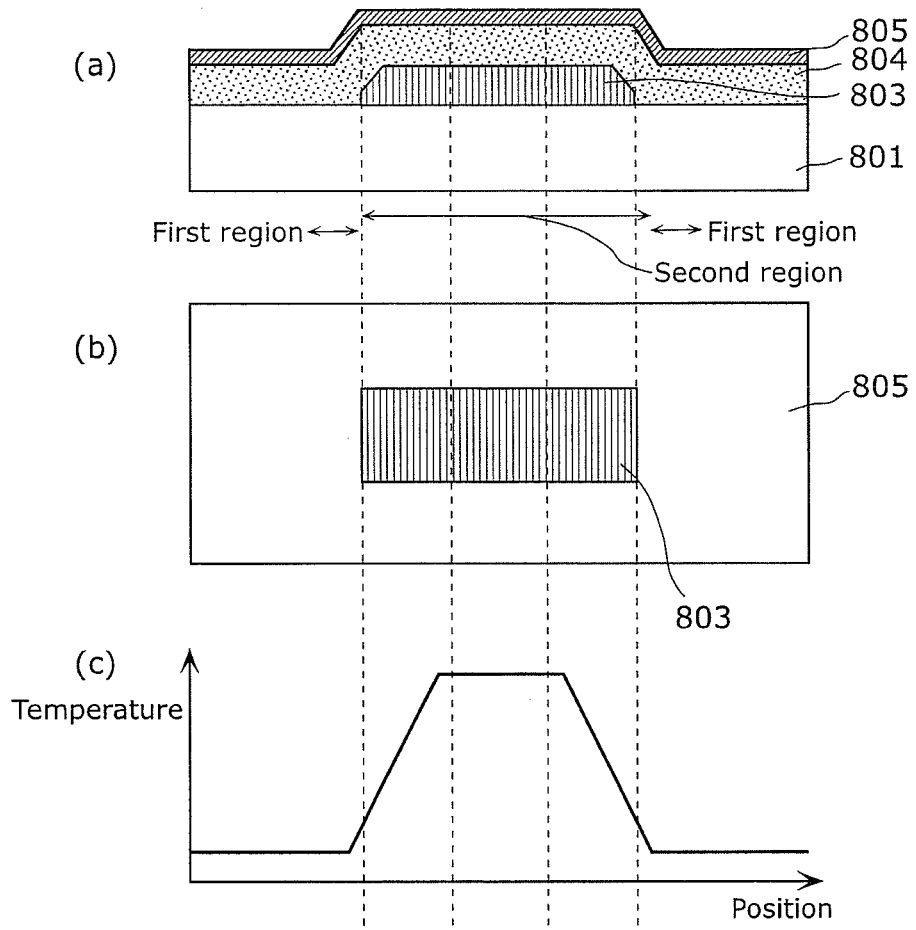
FIG. 7 is a diagram illustrating a temperature distribution of a noncrystalline silicon thin film in a conventional bottom-gate TFT at the time of irradiation with a laser beam.

FIG. 7 is a diagram illustrating a temperature distribution of a noncrystalline silicon thin film in a conventional bottom-gate TFT at the time of irradiation with a laser beam. (a) and (b) in FIG. 7 correspond to FIG. 5A and FIG. 5B and thus the description for them is omitted. (c) in FIG. 7 is a diagram illustrating a temperature distribution of the silicon thin film 805 at the time of irradiation with a laser beam in the process of crystallizing a silicon thin film.

Assume that the noncrystalline silicon thin film 805 shown in (a) and (b) in FIG. 7 is irradiated with a laser beam, for example. In this case, in addition to a temperature increase of the noncrystalline silicon thin film 805 due to the laser beam irradiated from above the noncrystalline silicon thin film 805, the temperature of the noncrystalline silicon thin film 805 increases due to a laser beam reflected from the gate electrode 803. Accordingly, the first region in which the gate electrode 803 is not present is not affected by the reflected light from the gate electrode 803. In contrast, the second region in which the gate electrode 803 is present is affected by the reflected light from the gate electrode 803.

Therefore, the temperature increase of the noncrystalline silicon thin film 805 due to the laser beam is relatively greater in the region of the noncrystalline silicon thin film 805 corresponding to the second region in which the gate electrode 803 is present than in the region of the noncrystalline silicon thin film 805 corresponding to the first region in which the gate electrode 803 is not present. In addition, heat that occurs in the noncrystalline silicon thin film 805 due to the irradiation of the laser beam diffuses from the region of the noncrystalline silicon thin film 805 corresponding to the second region in which the gate electrode 803 is present to the region of the noncrystalline silicon thin film 805 corresponding to the first region in which the gate electrode 803 is not present. More specifically, as shown in (c) in FIG. 7, the temperature distribution resulting from the irradiation of the laser beam in the noncrystalline silicon thin film 805 has gradient in the region corresponding to the edge portion (end portion) of the second region in which the gate electrode 803 is present. Then the noncrystalline silicon thin film 805 is crystallized as having such a temperature distribution.

With this, the size of the formed crystalline grains differs between the crystalline silicon thin film corresponding to the center of the gate electrode 803 and the crystalline silicon thin film corresponding to the end portion (edge portion) of the gate electrode 803.

With the above-described mechanism, non-uniformity of the crystalline grain size (crystalline structure non-uniformity) is caused in the crystalline silicon thin film corresponding to the region in which the gate electrode 803 is present, in the conventional bottom-gate TFT.

In contrast, according to the present embodiment, a configuration and a manufacturing method are implemented which prevent non-uniformity of the crystalline grain size in the crystalline silicon thin film corresponding to the region in which the gate electrodes (the first gate electrode 2 and the second gate electrode 3) are present. More specifically, the first gate electrode 2 and the second gate electrode 3 are formed as the gate electrodes as shown in (a) in FIG. 4 and the noncrystalline silicon thin film 5a is irradiated with a laser beam, thereby implementing the configuration and the manufacturing method. To be more specific, the first gate electrode 2 having the first reflectivity is stacked on the substrate 1 and the second gate electrode 3 having the second reflectivity that is lower than the first reflectivity and a top face area smaller than a top face area of the first gate electrode 2 is stacked such that a fringe portion of the top face of the first gate electrode 2 is exposed. Then the noncrystalline silicon thin film 5a is irradiated with a laser beam to be crystallized, as described above. At this time, since the first reflectivity is higher than the second reflectivity, the temperature of the noncrystalline silicon thin film 5a corresponding to the first region is higher than the temperature of the noncrystalline silicon thin film 5a corresponding to the second region. Thus, when crystallizing the noncrystalline silicon thin film 5a by irradiation with a laser beam, it is possible to set a higher temperature for the noncrystalline silicon thin film of the region corresponding to the second gate electrode 3 than the temperature of the noncrystalline silicon thin film 5a corresponding to the first gate electrode 2 which is present in an outer circumference of the second gate electrode 3. This can prevent the temperature of the noncrystalline silicon thin film 5a corresponding to the both end portions of the second gate electrode 3 from diffusing from the region corresponding to the second gate electrode 3 to the region corresponding to outside the region in which second gate electrode 3 is formed. As a result, the crystalline grain size becomes substantially uniform in the crystalline silicon thin film 5 of the region that corresponds to the second gate electrode 3. More specifically, the crystalline grain size in the center region and the fringe region of the crystalline silicon thin film 5, which become the channel region, can be uniformed.

Next, it is verified by simulation that the temperature distribution as shown in (b) and (c) in FIG. 4 is obtained when the noncrystalline silicon thin film 5a is irradiated with a laser beam in the formed bottom-gate silicon TFT device 100 in which the gate electrodes (the first gate electrode 2 and the second gate electrode 3) are included as described above.

The following explains this as an example.

Example

Figure 8A:
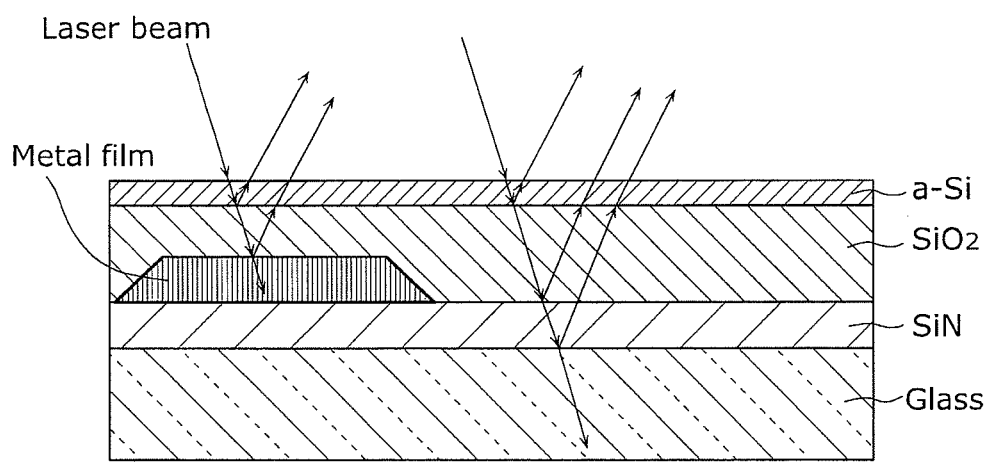
FIG. 8A is a diagram illustrating a model structure used for calculation in an example according to the present invention.

FIG. 8A and FIG. 8B are diagrams each of which illustrates a model structure and a parameter used for calculation in the example. Here, k is an attenuation coefficient.

In the model structure shown in FIG. 8A, a glass is placed as a substrate, a SiN film having a thickness of 150 nm is placed on the glass, and a metal film having a thickness of 50 nm is placed on the SiN film. A $SiO_2$ film having a variable thickness is placed on the SiN film to cover the metal film, and an a-Si film is placed on the $SiO_2$ film. An air layer having a refraction index of 1 is provided above the a-Si film. Here, this model structure is a modelization of a structure of the bottom-gate TFT according to the embodiment shown in (a) in FIG. 4. Here, the SiN film corresponds to the substrate 1 shown in FIG. 4 and the metal film corresponds to the first gate electrode 2. The $SiO_2$ film corresponds to the gate insulation film 4 and the a-Si film corresponds to the noncrystalline silicon thin film 5a.

A rate of absorption of a light into the a-Si film caused by multiple interaction is calculated using a known amplitude transmittance and a calculation method of the amplitude transmittance; that is, using values shown in FIG. 8B when a laser beam having a wavelength of 532 nm enters vertically with respect to the model structure shown in FIG. 8A. Here, FIG. 8B shows the refraction index and the attenuation coefficient when the wavelength is 532 nm, for the a-Si film, the $SiO_2$ film, the SiN film, the Al metal film, the Cu metal film, and the Mo metal film. In addition, a magnitude correlation of the reflectivity of the metals is Al>Cu>Mo.

Figure 9C:
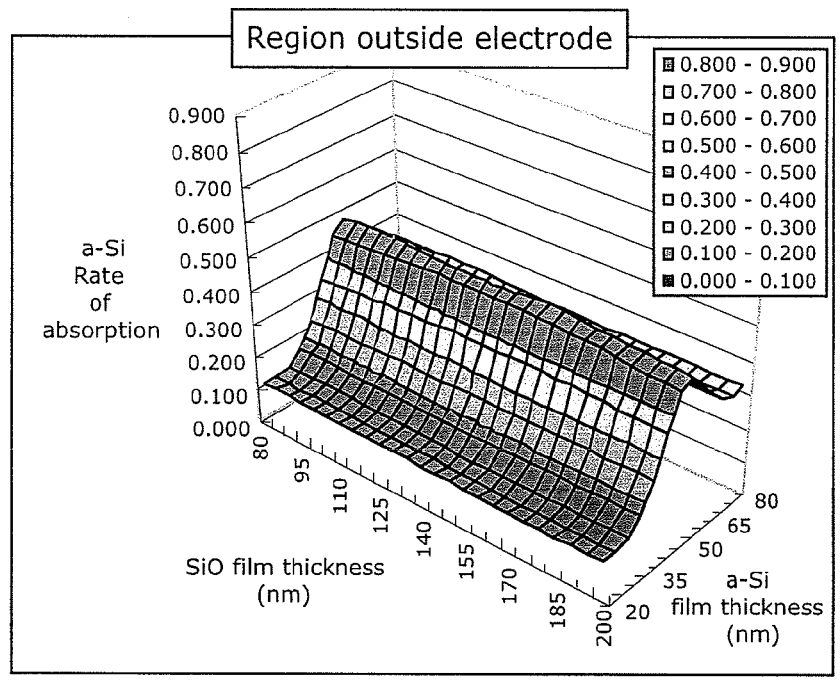
FIG. 9C is a diagram illustrating a calculation result when the thickness of an a-Si film and the thickness of SiO$_2$ film are changed in the model structure shown in FIG. 9A.

FIG. 9A shows a model structure when Mo is used as the metal film shown in FIG. 8A (denoted as Mo electrode). FIG. 9B and FIG. 9C are diagrams each of which illustrates a calculation result when the thickness of the a-Si film and the thickness of the $SiO_2$ film are changed in the model structure shown in FIG. 9A. Here, FIG. 9B shows the calculation result when the thickness of the a-Si film and the thickness of the $SiO_2$ film are changed in a region above the electrode (the region corresponding to the region in which the Mo electrode is present) in the model structure shown in FIG. 9A. On the other hand, FIG. 9C shows the calculation result when the thickness of the a-Si film and the thickness of the $SiO_2$ film are changed in a region outside the electrode (the region corresponding to the region in which the Mo electrode is not present) in the model structure shown in FIG. 9A.

As shown in FIG. 9B and FIG. 9C, the rate of absorption of the a-Si film is likely to be higher in the region above the electrode compared to the region outside the electrode. More specifically, it is shown that, when the a-Si film is irradiated with the laser beam, the temperature becomes higher in the region above the electrode as described in FIG. 7. However, as shown in FIG. 9B, it is shown that there is a region in which such a tendency is not found, depending on the thickness of the a-Si film. This means that there is an appropriate range (process window) of the thickness for forming the a-Si film. Accordingly, the appropriate range of the thickness for the a-Si film to be formed is the region in which the rate of absorption into the a-Si film is "the region above the electrode>the region outside the electrode".

Figure 10A:
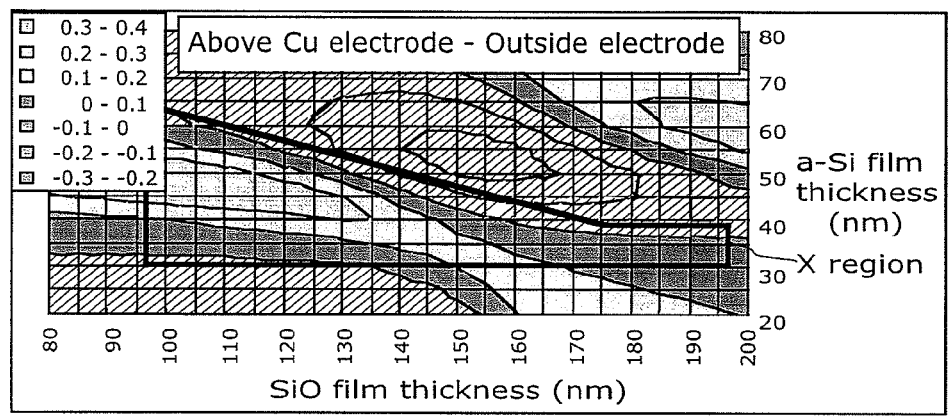
FIG. 10A is a diagram illustrating the difference in a rate of absorption into the a-Si film between a region outside an electrode and a region on the electrode when the thickness of the a-Si film and the thickness of the SiO$_2$ film are changed in the model structure shown in FIG. 9A.
Figure 10B:
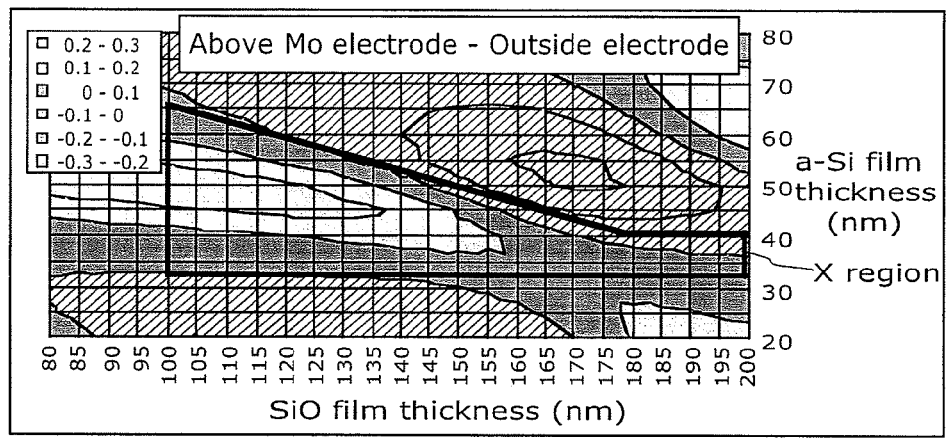
FIG. 10B is a diagram illustrating the difference in the rate of absorption into the a-Si film between the region outside the electrode and the region on the electrode when the thickness of the a-Si film and the thickness of the SiO$_2$ film are changed in the model structure shown in FIG. 9A.
Figure 10C:
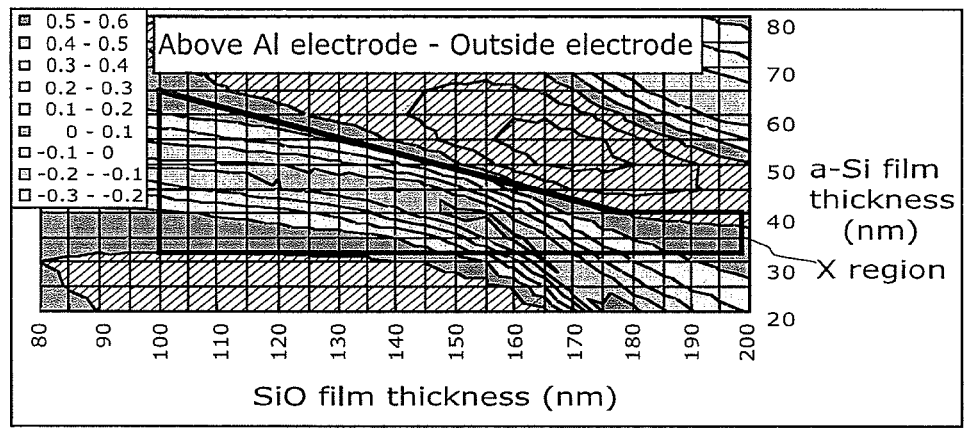
FIG. 10C is a diagram illustrating the difference in the rate of absorption into the a-Si film between the region outside the electrode and the region on the electrode when the thickness of the a-Si film and the thickness of the SiO$_2$ film are changed in the model structure shown in FIG. 9A.

FIG. 10A to FIG. 10C are diagrams illustrating the difference in the rate of absorption into the a-Si film between the region outside the electrode and the region above the electrode when the thickness of the a-Si film and the thickness of the $SiO_2$ film are changed in the model structure shown in FIG. 9A. Here, FIG. 10A shows a calculation result in the case where the material included in the metal film is Cu (hereinafter referred to as Cu electrode), FIG. 10B shows a calculation result in the case where the material included in the metal film is Mo (hereinafter referred to as Mo electrode), and FIG. 10C shows a calculation result in the case where the material included in the metal film is Al (hereinafter referred to as Al electrode).

As shown in FIG. 10A to FIG. 10C, the region X in which the rate of absorption into the a-Si film is "the region above the electrode>the region outside the electrode" is present irrespective of what the material included in the metal film is.

More specifically, the range of the thickness of the a-Si film which satisfies the conditions is shown in 1) or 2) below.

1) 30 nm<a-Si film<40 nm, where 180 nm<SiO film thickness<200 nm.

2) a-Si film thickness<30 nm, and a-Si film thickness<(−⅓× SiO film thickness+100 nm), where 100 nm<SiO film thickness<180 nm. Next, whether or not there is an appropriate range of the thickness for the a-Si film to be formed is verified in the same manner as above in the case where metal films each of which has different reflectivity is stacked (corresponding to the bottom-gate silicon TFT device 100 including the first gate electrode 2 and the second gate electrode 3 each of which has a different reflectivity).

Figure 11A:
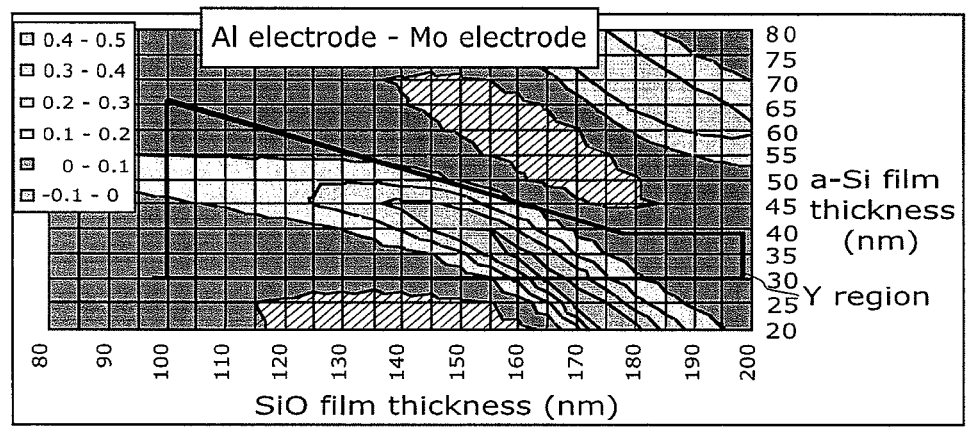
FIG. 11A is a diagram for explaining that there is an appropriate range for the a-Si film formed in the model structure shown in FIG. 11D.
Figure 11B:
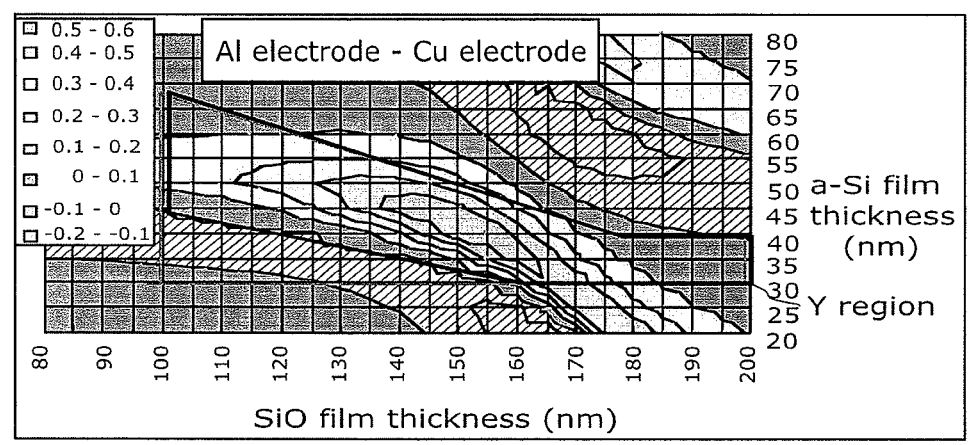
FIG. 11B is a diagram for explaining that there is an appropriate range for the a-Si film formed in the model structure shown in FIG. 11D.
Figure 11C:
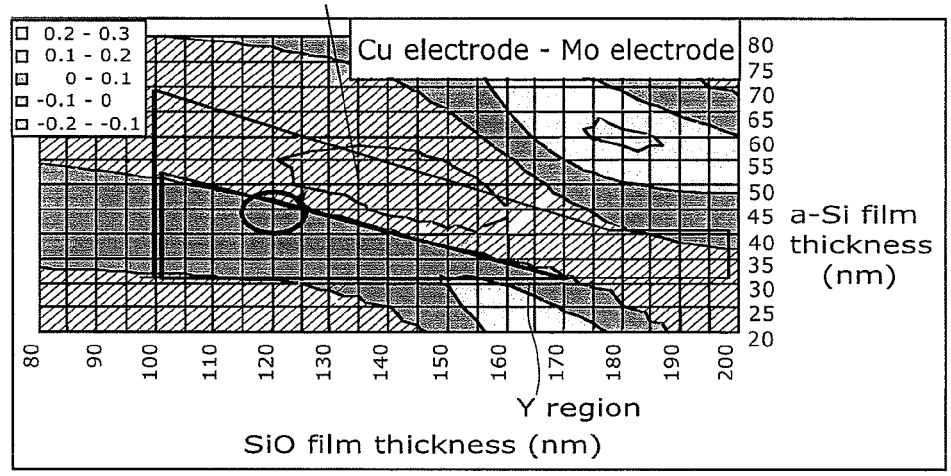
FIG. 11C is a diagram for explaining that there is an appropriate range for the a-Si film formed in the model structure shown in FIG. 11D.
Figure 11D:
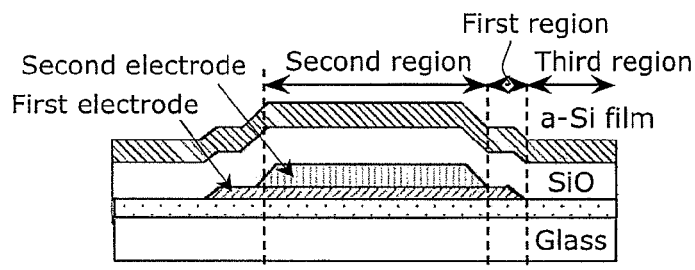
FIG. 11D is a diagram illustrating the model structure.

FIG. 11A to FIG. 11D are diagrams for explaining that there is an appropriate range for the thickness of the a-Si film to be formed. FIG. 11D shows a model structure in the case where the metal film in FIG. 8A is formed by stacking metal films (hereinafter referred to as a first electrode and a second electrode) each of which has a different reflectivity. Here, the second electrode is a metal film stacked in a region which is part of a region above the first electrode, and includes a metal film which has a reflectivity lower than a reflectivity of the first electrode.

FIG. 11A to FIG. 11C show the difference of the rate of absorption into the a-Si film between in the region of the first electrode and in the region of the second electrode when the thickness of the a-Si film and the thickness of the SiO₂ are changed in the model structure shown in FIG. 11D; that is, the case where the rate of absorption into the a-Si film that is the region above the second electrode is subtracted from the rate of absorption into the a-Si film that is the region above the first electrode. Here, the calculation results are shown, in the case where the combination of the metal material constituting the first electrode and the second electrode is (Al, Mo) in FIG. 11A, (Al, Cu) in FIG. 11B, and (Cu, Mo) in FIG. 11C.

As shown in FIG. 11A to FIG. 11C, the range (process window) of the appropriate film thickness in forming the a-Si film is the region in which the rate of absorption into the a-Si film is "the region above the first electrode>the region above the second electrode". In addition, the region Y in which the rate of absorption into the a-Si film is "the region above the first electrode>the region above the second electrode" is present irrespective of what the material constituting the metal film is.

From the simulation results described above, it is confirmed that, when the noncrystalline silicon thin film 5a is irradiated with a laser beam in the formed bottom-gate silicon TFT device 100 which includes the gate electrodes (the first gate electrode 2 and the second gate electrode 3), the a-Si film thickness which shows the characteristic of the temperature distribution shown in (b) and (c) in FIG. 4 is present in the noncrystalline silicon thin film 5a.

Next, the difference of the size (width) between the first electrode and the second electrode is examined, which is necessary for the temperature distribution shown in (b) and (c) in FIG. 4.

Figure 12:
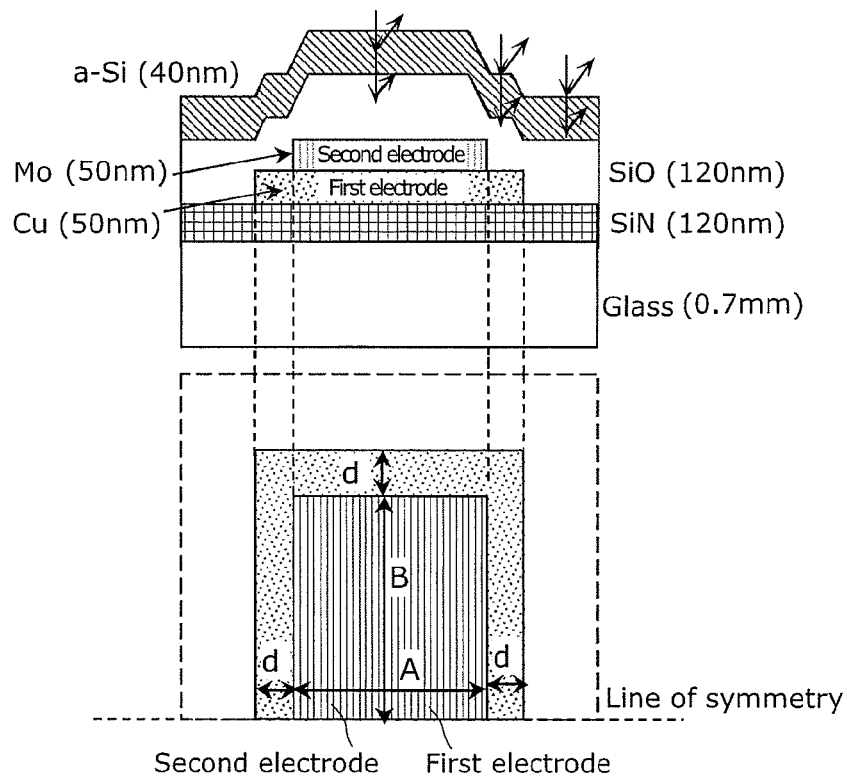
FIG. 12 is a diagram illustrating the model structure used for the calculation in the example.

FIG. 12 is a diagram illustrating the model structure used for the calculation in this example. FIG. 13 and FIG. 14 are diagrams each of which illustrates the parameter used for the calculation in this example.

In the model structure shown in FIGS. 12 to 14, a SiN film which has a thickness of 120 nm is placed on a glass having a thickness of 0.7 mm as a substrate, for example, and metal films (the first electrode and the second electrode) each of which has a thickness of 50 nm is placed on the SiN film. Then a SiO₂ film having a thickness of 120 nm is placed on the SiN film so as to cover the metal films (the first electrode and the second electrode) and a a-Si film having a thickness of 40 nm is placed on the SiO₂ film. An air layer having a refraction index of 1 is provided above the a-Si film. Here, this model structure is a modelization of a structure of the bottom-gate TFT according to the embodiment shown in (a) in FIG. 4, using the film thickness based on the above-described calculation result. In addition, the SiN film corresponds to the substrate 1 shown in FIG. 4. The first electrode that is the lower metal film of the metal films each having the different reflectivity corresponds to the first gate electrode 2 and the second electrode that is the upper metal film of the metal films each having the different reflectivity corresponds to the second gate electrode 3. The SiO₂ film corresponds to the gate insulation film 4 and the a-Si film corresponds to the noncrystalline silicon thin film 5a.

Furthermore, the size of the second electrode is A μm wide and 2B μm long, and the size of the first electrode is smaller by d mm in both wide and long compared to the second electrode; that is, (2B−2d) μm long and (A−d) μm wide, as shown in FIG. 12. Here, the vertical size B in the diagram shows the size up to a symmetry line.

Figure 15B:
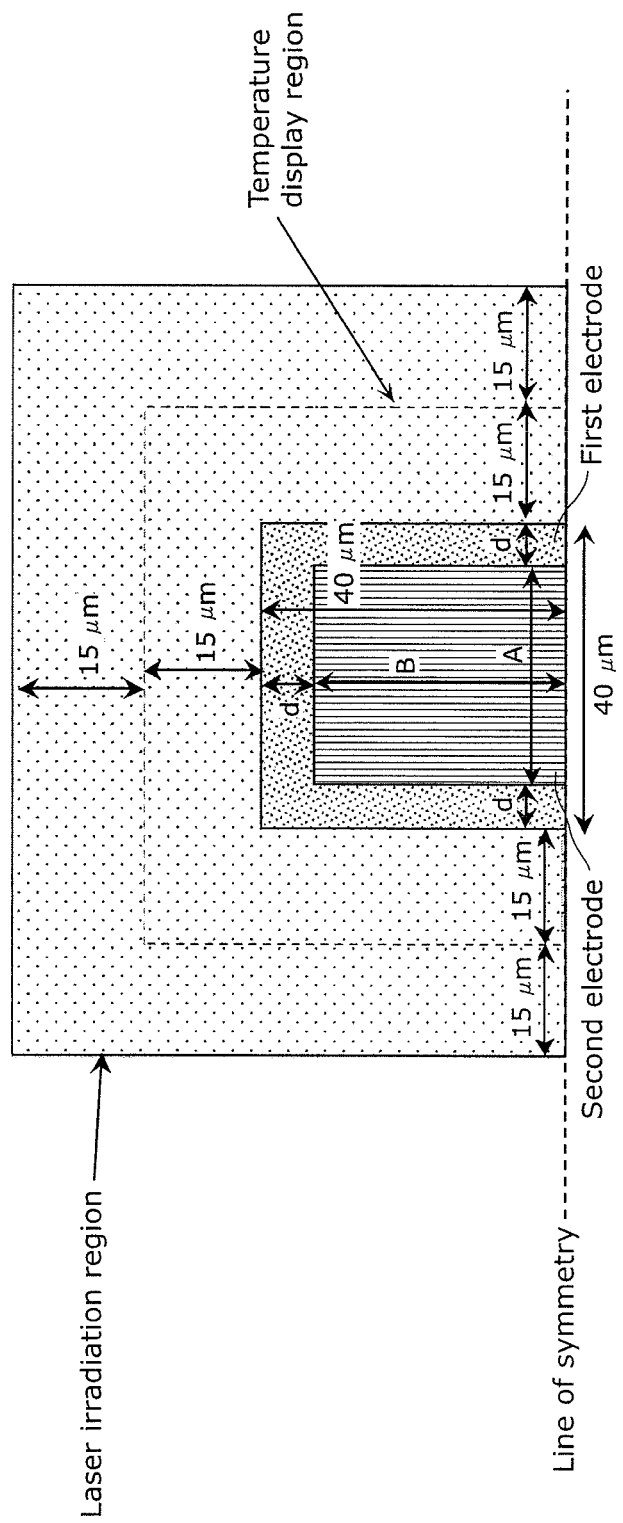
FIG. 15B is a diagram illustrating simulation conditions for a thermal analysis in the example.

FIG. 15A and FIG. 15B are diagrams each of which illustrates simulation conditions for a thermal analysis in this example. FIG. 15A shows the conditions (specification 1 to specification 3) of the size of the second electrode when the size of the first electrode is 80 μm long and 40 μm wide. More specifically, the specification 1 indicates the case of d=0 μm; that is, the case where the size of the first electrode and the size of the second electrode are the same 2B=80 μm long and A=40 μm wide. The specification 2 indicates the case of d=5 μm; that is, the case where the size of the second electrode is 2B=70 μm long and A=35 μm wide. Likewise, the specification 3 indicates the case of d=10 μm; that is, the case where the size of the second electrode is 2B=60 μm long and A=30 μm wide. FIG. 15B shows the size of the first electrode and the second electrode which corresponds to the conditions (specification 1 to specification 3) shown in FIG. 13. Here, a temperature display region of which the temperature is displayed by thermal analysis simulation is indicated by dashed lines.

It is to be noted that the conditions of the laser beam used in the thermal analysis simulation are as follows: a wavelength is 532 nm; an output is 3000 kW/cm2; a waveform is a pulse; a heat duration (irradiation period) is 0 to 10 nsec; a final time is 0 to 1 msec; and a spot waveform is rectangle.

Figures 16A, 16B:
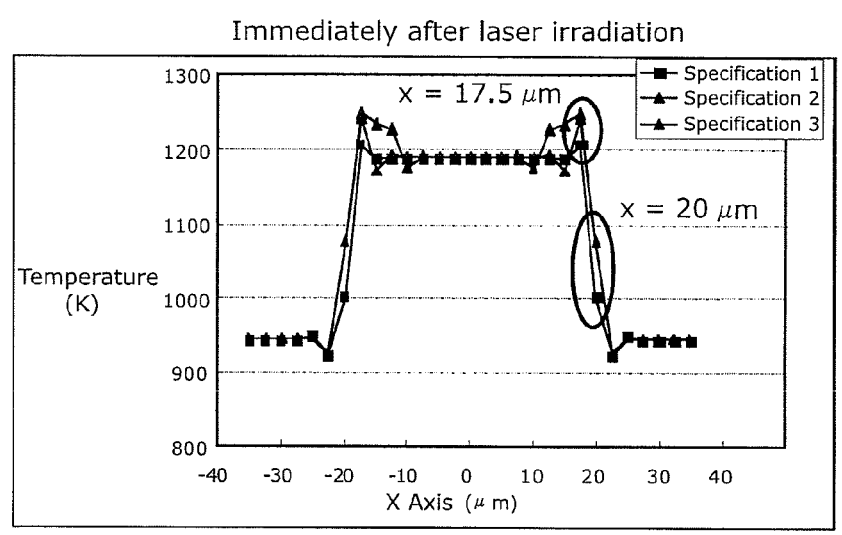
FIG. 16A is a diagram illustrating a result of the thermal analysis in each specification.
FIG. 16B is a diagram illustrating a result of the thermal analysis in each specification.

FIG. 16A and FIG. 16B are diagrams each of which illustrates a result of the thermal analysis for each of the specifications. FIG. 16A is a diagram illustrating a result of performing the simulation under the above conditions, and FIG. 16B shows a table of temperatures of x=17.5 μm and x=20 μm in FIG. 16A. Here, the temperature of x=17.5 μm indicates the temperature of the a-Si film above the second electrode in the case of the specifications 1 to 3). x=20.0 μm indicates temperature of the a-Si film above the second electrode in the case of the specification 1 and the temperature of the a-Si film above the first electrode in the case of the specifications 2 and 3.

The result of comparing the temperature differences in the edge portion (x=17.5 μm and x=20 μm) (FIG. 16B) is 240K for the specification 1 corresponding to the conventional structure, and 163K and 171K for the specification 2 and the specification 3, respectively. With this, the effect of improvement in the temperature difference is confirmed in the edge portion.

These results verified that it is only necessary for the difference d in the size of the first electrode and the second electrode to be at least d>5 μm; that is, the difference in the size of exposing the first electrode by approximately 12% or more.

According to the present invention, not only the first gate electrode and the second gate electrode each having a different reflectivity, but also the first region is formed by partially exposing the first gate electrode having a higher reflectivity from the second gate electrode, as described above. With the configuration described above, irradiating the noncrystalline silicon thin film with a laser beam allows forming in the first region a region having a higher temperature distribution than that of the second region, and thus it is possible, by utilizing heat diffusion, to alleviate the difference between the temperature above the gate electrodes (first gate electrode 2 and the second gate electrode 3) and the temperature outside the gate electrodes. This makes it possible to uniform the crystalline grain size of the crystalline silicon thin film 5 that corresponds to the region above the gate electrodes (first gate electrode 2 and the second gate electrode 3).

The method of crystallizing the silicon thin film and the method of manufacturing the silicon TFT device according to the present invention have been described based on the embodiment; however, the present invention is not limited to the embodiment. Other forms in which various modifications apparent to those skilled in the art are applied to the embodiment, or forms structured by combining elements of different embodiments are included within the scope of the present invention, unless such changes and modifications depart from the scope of the present invention.

INDUSTRIAL APPLICABILITY

The present invention is useful for the method of crystallizing a silicon thin film and a method of manufacturing a silicon TFT device, and in particular, is optimal to be used as a method of manufacturing a silicon TFT device which excels in both the mobility and the on/off characteristic.

What is claimed is:

1. A method of crystallizing a silicon thin film, the method comprising:
    placing a substrate;
    stacking a first gate electrode on the substrate, the first gate electrode having a first reflectivity and a top face which is flat;
    stacking a second gate electrode on the first gate electrode such that a first region, which is a flat plane of a fringe portion in the top face of the first gate electrode, is exposed, the second gate electrode having a second reflectivity lower than the first reflectivity and the second gate electrode having a second region which is a flat plane in a top face of the second gate;
    stacking a gate insulation film on the second gate electrode and the first region of the first gate electrode;
    stacking a silicon thin film on the gate insulation film to cover a portion of the gate insulation film; and
    crystallizing the silicon thin film by irradiating the silicon thin film from above with a laser beam,
    wherein in crystallizing the silicon thin film, the first region is not covered by the second gate electrode, and a size of the first region is larger than a size of the second region by 12% or more,
    the temperature of the silicon thin film corresponding to the first region becomes higher than the temperature of the silicon thin film corresponding to the second region, during the irradiation of the laser beam onto the silicon thin film, and
    the temperature of the silicon thin film corresponding to the first region becomes substantially a same as the temperature of the silicon thin film corresponding to the second region, after the silicon thin film is irradiated with the laser beam, so that the silicon thin film corresponding to the first region and the silicon thin film corresponding to the second region crystallize.

2. The method of crystallizing a silicon thin film according to claim 1,
    wherein in the crystallizing the silicon thin film, the silicon thin film corresponding to the first region and the silicon thin film corresponding to the second region are concurrently irradiated with the laser beam.

3. The method of crystallizing a silicon thin film according to claim 1,
    wherein a crystalline grain size in the silicon thin film corresponding to the second region is substantially uniform due to a relationship between the first reflectivity and the second reflectivity.

4. The method of crystallizing a silicon thin film according to claim 1,
    wherein the first region and the second region are irradiated by the laser beam and a surface of the first region and a surface of the second region are perpendicular to the axis of the incident laser beam.

5. A method of crystallizing a silicon thin film, the method comprising:
    placing a substrate;
    stacking a first gate electrode on the substrate, the first gate electrode having a first reflectivity and a top face which is flat;
    stacking a second gate electrode on the first gate electrode such that a first region, which is a flat plane of a fringe portion in the top face of the first gate electrode, is exposed, the second gate electrode having a second reflectivity lower than the first reflectivity and the second gate electrode having a second region which is a flat plane in a top face of the second gate;
    stacking a gate insulation film on the second gate electrode and the first region of the first gate electrode;
    stacking a silicon thin film on the gate insulation film to cover a portion of the gate insulation film; and
    crystallizing the silicon thin film by irradiating the silicon thin film from above with a laser beam,
    wherein in crystallizing the silicon thin film, the first region is not covered by the second gate electrode and is the flat plane of the fringe portion in the top face of the first gate electrode, a size of the first region is larger than a size of the second region by 12% or more,
    the first region and the second region are irradiated by the laser beam and a surface of the first region and a surface of the second region are perpendicular to the axis of the incident laser beam,
    the temperature of the silicon thin film corresponding to the first region becomes higher than the temperature of the silicon thin film corresponding to the second region, during the irradiation of the laser beam onto the silicon thin film, and
    the temperature of the silicon thin film corresponding to the first region becomes substantially a same as the temperature of the silicon thin film corresponding to the second region, after the silicon thin film is irradiated with the laser beam, so that the silicon thin film corresponding to the first region and the silicon thin film corresponding to the second region crystallize.

6. The method of crystallizing a silicon thin film according to claim 5, wherein the given laser beam has a wavelength in a range of 405 nm to 632 nm.

7. The method of crystallizing a silicon thin film according to claim 6,
wherein the given laser beam is a green laser beam.

8. The method of crystallizing a silicon thin film according to claim 6,
wherein the given laser beam is a blue laser beam.

9. The method of crystallizing a silicon thin film according to claim 5,
wherein an end portion of the second gate electrode has a predetermined inclination angle.

10. The method of crystallizing a silicon thin film according to claim 5,
wherein in the crystallizing the silicon thin film, a laser beam intensity profile of the laser beam is flat at least in the first region and in the second region.

11. A method of manufacturing a silicon thin-film transistor (TFT) device, said method of manufacturing comprising:
the method of crystallizing a silicon thin film according to claim 5;
subsequently forming source and drain electrodes on (i) an end portion of a top face and a side face of an insulation film formed on part of the crystallized silicon thin film and (ii) a top face of the crystallized silicon thin film; and
forming a passivation film on the insulation film and the source and drain electrodes.

12. The method of manufacturing a silicon TFT device according to claim 11, the method of manufacturing further comprising:
forming a contact layer on (i) the end portion of the top face and the side face of the insulation film and (ii) the top face of the crystallized silicon thin film, the process of forming a contact layer being performed between the crystallizing the silicon thin film and the forming source and drain electrodes.

\* \* \* \* \*

UNITED STATES PATENT AND TRADEMARK OFFICE
CERTIFICATE OF CORRECTION

| | |
|---|---|
| PATENT NO. | : 9,048,220 B2 |
| APPLICATION NO. | : 13/228804 |
| DATED | : June 2, 2015 |
| INVENTOR(S) | : Tomohiko Oda et al. |

Page 1 of 1

It is certified that error appears in the above-identified patent and that said Letters Patent is hereby corrected as shown below:

On the Title Page, Page 2, References Cited, U.S. PATENT DOCUMENTS, of the printed patent, please insert --2007/0015323  A1   1/2007 Isobe et al.--.

Signed and Sealed this
Ninth Day of February, 2016

Michelle K. Lee
*Director of the United States Patent and Trademark Office*